(12) United States Patent
Ii

(10) Patent No.: US 9,640,780 B2
(45) Date of Patent: May 2, 2017

(54) GAS BARRIER FILM, METHOD FOR PRODUCING GAS BARRIER FILM, AND ORGANIC ELECTROLUMINESCENT ELEMENT

(71) Applicant: Konica Minolta, Inc., Tokyo (JP)

(72) Inventor: Hiromoto Ii, Tokyo (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 14/772,251

(22) PCT Filed: Mar. 7, 2014

(86) PCT No.: PCT/JP2014/056065
§ 371 (c)(1),
(2) Date: Sep. 2, 2015

(87) PCT Pub. No.: WO2014/142036
PCT Pub. Date: Sep. 18, 2014

(65) Prior Publication Data
US 2016/0035999 A1    Feb. 4, 2016

(30) Foreign Application Priority Data

Mar. 11, 2013    (JP) .................................. 2013-048381

(51) Int. Cl.
*H01L 51/52*    (2006.01)
*C23C 16/48*    (2006.01)
(Continued)

(52) U.S. Cl.
CPC ........ *H01L 51/5253* (2013.01); *B32B 27/283* (2013.01); *C23C 16/482* (2013.01);
(Continued)

(58) Field of Classification Search
None
See application file for complete search history.

(56) References Cited

U.S. PATENT DOCUMENTS

2009/0167164 A1* 7/2009 Fukuda .................... C09D 1/00
                                                            313/504
2013/0115423 A1* 5/2013 Ii .............................. B05D 5/00
                                                            428/141
(Continued)

FOREIGN PATENT DOCUMENTS

JP    2008-235165 A    10/2008
JP    2009-252739 A    10/2009
(Continued)

OTHER PUBLICATIONS

International Search Report issued in PCT/JP2014/056065 mailed on Jun. 10, 2014 (2 pages).

(Continued)

*Primary Examiner* — Ashok Patel
(74) *Attorney, Agent, or Firm* — Osha Liang LLP

(57) ABSTRACT

An organic electroluminescent element provided with a gas barrier film includes a pair of electrodes and an organic functional layer having at least one light-emitting layer between the electrodes. The gas barrier film includes a base material; a vapor deposition layer that is of a surface-treated silicon compound including at least one element selected from carbon (C), nitrogen (N), and oxygen (O), and has a continuous change in composition from a surface toward a direction of thickness; and a polysilazane modified layer.

11 Claims, 5 Drawing Sheets

10

(51) Int. Cl.
　　　*C23C 16/50* (2006.01)
　　　*B32B 27/28* (2006.01)

(52) U.S. Cl.
　　　CPC .......... *C23C 16/50* (2013.01); *B32B 2255/24* (2013.01); *B32B 2307/422* (2013.01); *B32B 2307/7242* (2013.01); *H01L 2251/5346* (2013.01)

(56) References Cited

U.S. PATENT DOCUMENTS

| | | | | |
|---|---|---|---|---|
| 2013/0236710 | A1* | 9/2013 | Honda | C23C 16/483 428/212 |
| 2013/0252002 | A1* | 9/2013 | Suzuki | H05B 33/04 428/448 |
| 2013/0280521 | A1* | 10/2013 | Mori | C23C 14/0676 428/332 |
| 2014/0106151 | A1* | 4/2014 | Mori | H01L 51/5253 428/216 |

FOREIGN PATENT DOCUMENTS

| | | | |
|---|---|---|---|
| JP | 2012-084307 A | | 4/2012 |
| JP | 2012-084353 A | | 4/2012 |
| JP | 2012-106421 A | | 6/2012 |
| JP | 2013-226758 A | | 11/2013 |
| JP | 2014-083691 A | | 5/2014 |
| WO | WO 2012067230 | * | 5/2012 |
| WO | WO 2012-077553 | * | 6/2012 |
| WO | 2012090644 A1 | | 7/2012 |
| WO | WO 2012-090644 | * | 7/2012 |
| WO | WO 2013-002026 | * | 1/2013 |

OTHER PUBLICATIONS

Office Action issued in corresponding Chinese Application No. 201480012546.7 dated May 12, 2016, and English translation thereof (17 pages).

* cited by examiner

GAS BARRIER FILM, METHOD FOR PRODUCING GAS BARRIER FILM, AND ORGANIC ELECTROLUMINESCENT ELEMENT

TECHNICAL FIELD

The present invention generally relates to a gas barrier film, a method for producing the gas barrier film, and an organic electroluminescent element using the gas barrier film.

BACKGROUND ART

An organic electroluminescent element (hereinafter, referred to as "organic EL element") utilizing electroluminescence (hereinafter, referred to as "EL") of an organic material is a thin-film type completely-solid state element capable of emitting light at a low voltage of approximately several volts to several tens of volts, and has many excellent features such as high luminance, high light emission efficiency, small thickness and light weight. Accordingly, particularly in recent years, OLED having a barrier film of small thickness and light weight on a resin base material has attracted attention, as backlights for various kinds of displays, display boards such as a signboard and an emergency lamp, and surface emitting bodies such as illumination light sources.

With respect to these requirements to the barrier film, a barrier film having a high barrier property and smoothness, which is more suitable for the organic EL element has been proposed (for example, refer to Patent Literature No. 1). According to the method described in Patent Literature No. 1, the barrier film is formed by a vapor deposition system. An accumulated film like the vapor deposition system has a limitation on improvement of smoothness, and further improvement technique of the smoothness.

Furthermore, by introducing a smoothing layer to the surface of a barrier film, a technique that can simultaneously give both high barrier property and smoothness has been proposed (for example, refer to Patent Literature No. 2). However, although a smoothness can be obtained according to Patent Literature No. 2, the barrier property is not enough, and thus the storability of the organic EL element is poor.

Moreover, a technique that simultaneously gives both high barrier property and smoothness has been proposed by subjecting the barrier film of the vapor deposition system to eximer treatment and further forming a polysilazane layer (for example, referring to Patent Literature No. 3). However, according to Patent Literature No. 3, in the production process of an organic EL element, in which an adhesive strength between the vapor deposition film and the polysilazane layer is lowered and the bending characteristics of the organic EL elements is deteriorated.

CITATION LIST

Patent Literature

PTL 1: Japanese Patent Application Laid-Open Publication No. 2012-084353
PTL 2: Japanese Patent Application Laid-Open Publication No. 2008-235165
PTL 3: Japanese Patent Application Laid-Open Publication No. 2012-106421

SUMMARY OF INVENTION

A gas barrier film which has a high gas barrier property and which can enhance reliability of the organic electroluminescent element when being applied to an organic electroluminescent element, and an organic electroluminescent element capable of enhancing reliability by using the gas barrier film.

The invention may provide a gas barrier film having a high reliability, and an organic electroluminescent element having a high reliability.

A gas barrier film of the invention includes: a base material; a vapor deposition layer that is of a surface-treated silicon compound, contains at least one element selected from carbon (C), nitrogen (N), and oxygen (O), and has a continuous change in composition from the surface toward the direction of thickness; and a polysilazane modified layer.

Furthermore, a method for producing a gas barrier film in accordance with one or more embodiments of the invention includes the steps of: forming, on a base material, a vapor deposition layer that contains at least one element selected from carbon (C), nitrogen (N), and oxygen (O), and has a continuous change in composition from the surface toward a direction of thickness; surface-treating the vapor deposition layer; and forming a polysilazane modified layer on the vapor deposition layer after being surface-treated.

Moreover, an organic electroluminescent element in accordance with one or more embodiments of the invention includes: the above gas barrier film; a pair of electrodes; and an organic functional layer having at least one light-emitting layer between the electrodes.

According to the gas barrier film and the production method of the gas barrier film in accordance with one or more embodiments of the invention, by the continuous change in composition from the surface toward the direction of thickness, the surface treatment of the vapor deposition layer becomes satisfactory and then the adhesion to the polysilazane layer is enhanced. As a result, the reliability of the gas barrier film is enhanced.

In addition, it is possible to constitute the organic electroluminescent element having a high reliability by using the gas barrier film.

According to embodiments, a gas barrier film having a high reliability and an organic electroluminescent element having a high reliability can be provided.

DESCRIPTION OF EMBODIMENTS

Hereinafter, embodiments of the invention will be explained, but the invention is not limited to the following examples.

The explanation is done in the following order.
1. Embodiment of gas barrier film
2. Production method of gas barrier film
3. Embodiment of organic electroluminescent element <1. Embodiment of Gas Barrier Film>

[Configuration of Gas Barrier Film]

A specific embodiment of the gas barrier film in accordance with one or more embodiments of the invention will be explained.

Figure 1:
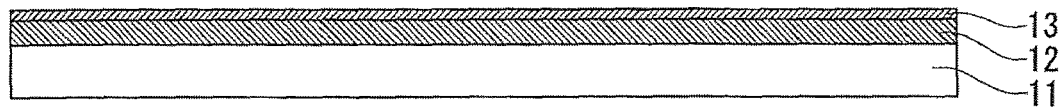
FIG. 1 is a view illustrating a schematic configuration of a gas barrier film of a first embodiment.

FIG. 1 is a schematic configuration diagram (cross-sectional view) illustrating the configuration of the gas barrier film of the first embodiment. As illustrated in FIG. 1, the gas barrier film 10 is provided with a base material 11, a vapor deposition layer 12 of a silicon compound, and a polysilazane modified layer 13.

Note that, in the gas barrier film 10 in accordance with one or more embodiments of the invention, the light transmission property means that a light transmittance at a wavelength of 550 nm is 50% or more.

In the gas barrier film 10 of the present embodiment, the vapor deposition layer 12 of the silicon compound containing at least one element selected from C, N and O is formed on the base material 11. In addition, the polysilazane modified layer 13 is formed on the vapor deposition layer 12 of the silicon compound.

In the gas barrier film 10, the silicon compound constituting the above-described vapor deposition layer 12 contains at least one element selected from carbon (C) nitrogen (N), and oxygen (O). Additionally, the vapor deposition layer 12 has the continuous change in composition from the surface toward the direction of thickness by changing an element ratio of at least one element selected from C, N, and O.

Furthermore, on the surface (front surface) side of the vapor deposition layer 12 where the polysilazane modified layer 13 is formed, the silicon compound is surface-treated before formation of the polysilazane modified layer 13.

In the gas barrier film, the polysilazane modified layer 13 is a layer subjected to modification treatment after coating and drying a liquid containing a silazane compound.

Hereinafter, the configuration of the gas barrier film 10 will be explained in detail.

[Base Material]

The base material 11 applied to the gas barrier film 10 is not particularly limited as long as it is a flexible base material which can give flexibility to the gas barrier film 10. Examples of the flexible base material can include a transparent resin film.

Examples of the resin film include, for example, polyesters such as polyethylene terephthalate (PET) and polyethylene naphthalate (PEN), polyethylene, polypropylene, cellulose esters or derivative thereof such as cellophane, cellulose diacetate, cellulose triacetate (TAC), cellulose acetate butylate, cellulose acetate propionate (CAP), cellulose acetate phthalate and cellulose nitrate, polyvinylidene chloride, polyvinyl alcohol, polyethylene vinyl alcohol, syndiotactic polystyrene, polycarbonate, norbornen resin, polymethylpenten, polyether ketone, polyimide, polyether sulphone (PES), polyphenylene sulfide, polysluphones, polyether imide, polyether ketone imide, polyamide, fluoro resin, Nylon, polymethyl methacrylate, acryl or polyallylates, cycloolefins-based resins such as Alton (commercial name of JSR) and APEL (commercial name of Mitsui Chemicals), and the like.

Among the resin films, from the viewpoint of cost and availability, the films of polyethylene terephthalate (PET), polybutylene terephthalate, polyethylene naphthalate (PEN), polycarbonate (PC), and the like are used. Furthermore, from the viewpoint of light transmission property, heat resistance, adhesiveness to the vapor deposition layer 12 or the polysilazane modified layer 13, a heat-resistant transparent film having silsesquioxane having an organic inorganic hybrid configuration as a base structure is used.

A thickness of the base material 11 is approximately 5 to 500 µm, further 25 to 250 µm.

In addition, the base material 11 has a light transmission property. When the base material 11 has light transmission property, it becomes possible to make the gas barrier film 10 having light transmission property. Additionally, the light-transmitting gas barrier film 10 can be suitably used as a transparent substrate or a sealing film for an organic EL element, a solar cell, and the like.

[Vapor Deposition Layer]

The vapor deposition layer 12 is provided on the base material 11. The vapor deposition layer 12 is constituted of the silicone compound formed by the vapor deposition method. The silicon compound contains at least one element selected from carbon (C), nitrogen (N), and oxygen (O). In addition, the vapor deposition layer 12 has continuous change in composition from the surface toward the direction of thickness. Furthermore, the surface of the vapor deposition layer 12 is subjected to a modification treatment, with the result that a hydrophilic modified portion is formed on the surface of the silicon compound constituting the vapor deposition layer 12.

(Composition)

The silicon compound constituting the vapor deposition layer 12 has a feature of inclined change in the composition from the surface toward the depth direction (direction of thickness). The change in composition may be linear or curved, and it is that the change is substantially continuous.

The change in composition of the silicon compound is defined by a change in element ratios of arbitrary elements constituting the silicon compound. For example, in a silicone carbon oxide, an amount of change in composition of the silicon compound is defined by an amount of change in ratio of carbon element or oxygen element. Namely, the change in composition of the silicon compound is defined by a change in element ratios of an arbitrary one kind of element selected from C, N, and O which is contained in the silicon compound. Alternatively, the change in composition is defined by a change in total ratio of arbitrary elements selected from C, N, and O, for example, a total ratio of carbon and oxygen, a total ratio of carbon and nitrogen, or a total ratio of carbon, nitrogen and oxygen.

The continuous change in composition of the silicon compound of the vapor deposition layer 12 is that a ratio of any element selected from C, N, and O, or a total ratio of arbitrary elements is changed continuously from the surface toward the direction of thickness.

The meaning of substantially continuous change in composition is that a portion where an atom ratio of the element discontinuously changes is not included in the distribution curve of an arbitrary element selected from C, N, and O described below. Specifically, a distance (x, unit: nm) from the surface of the vapor deposition layer 12 calculated from an etching rate and an etching time, and an atom ratio of an arbitrary element, e.g. carbon (C, unit: at %) satisfy the condition represented by $[(dC/dx) \leq 0.5]$.

The composition of the silicon compound is changed by 5% or more at the region of 30 nm depth from the surface, more 10% or more. The composition of the silicon compound is changed by 5% or more at the region of 15 nm depth from the surface, more 10% or more.

The region where the composition of the silicon compound is changed in the depth direction is a region where the surface treatment to be described below becomes effective.

As to the change in composition of the silicon compound, the element ratio of at least one element selected from C, N, and O may continuously increases from the surface toward the direction of thickness, or may continuously decreases the surface toward the direction of thickness.

(Surface Treatment)

The surface (front surface) of the vapor deposition layer 12 on a side in contact with polysilazane modified layer 13 is modified by the surface-treatment. The surface treatment is carried out for enhancing adhesion to the polysilazane modified later 13. Therefore, the surface treatment of the vapor deposition layer 12 is required to be carried out before the formation of the polysilazane modified layer 13.

Considering that the resin film is used as the base material 11, a method in which the treatment can be carried out at a low temperature is selected as the method of the surface treatment. For example, a treatment by using plasma, ozone, and ultraviolet ray.

A hydrophilic group such as hydroxyl group (OH), acyl group (COH) or carboxyl group (COOH) is formed by the surface treatment, on the surface of the vapor deposition layer 12. The hydrophilic group enhances wettability of a coating liquid of a polysilazane when the polysilazane modified layer 13 is formed on the vapor deposition layer 12. Therefore, the formation of the polysilazane modified layer 13 is facilitated. Furthermore, the adhesion between the vapor deposition layer 12 and the polysilazane modified layer 13 is increased due to the physical or chemical interaction (Van der Waals force or hydrogen bonding) between the hydroxyl group (OH) and the like and the polysilazane.

For example, in the surface treatment by a Xe excimer lamp, the excimer lamp emits a vacuum ultraviolet ray (VUV) with a wavelength of 172 nm having a high photon energy. When the vapor deposition layer 12 is irradiated with the VUV, the bonding of silicon to carbon (Si—C) and the bonding of silicon to oxygen (Si—O) of the silicon compound constituting the vapor deposition layer 12 are cleaved by a photon energy.

Furthermore, the VUV is absorbed by oxygen to generate an active oxygen and ozone. The generated ozone is decomposed again to form an active oxygen.

The atoms decomposed from the silicon compound and the generated active oxygen are bonded to form the hydrophilic groups such as hydroxyl group (OH), acyl group (COH) and carboxyl group (COOH) on the surface of the vapor deposition layer.

Since the silicon compound constituting the vapor deposition layer 12 has the above-described continuous change in composition from the surface toward the depth direction, the modification of the silicon compound by the surface treatment is easily progressed from the surface toward the depth direction. This is estimated to be due to the following reason.

As one example, the modification treatment of the silicon compound is explained by referring to the bond of silicon and carbon (Si—C) of the silicon compound which is easily cleaved by the above excimer light, and the element ratio of carbon.

The case where the change in composition of the silicon compound increases continuously in the direction of thickness is set to a configuration in which the element ratio of carbon is high in the surface of the vapor deposition layer 12 and decreases in the direction of thickness.

In the configuration, although the excimer light is absorbed in the surface where the element ratio of carbon is high, the transmittance of the excimer light becomes effective at the deep position where the element ratio of carbon is continuously lowered. Namely, since the transmittance up to the deep position is effective, the modification treatment at the deep position of the silicon compound is easily progressed.

The case where the change in composition of the silicon compound decreases continuously in the direction of thickness is set to a configuration in which the element ratio of carbon is small in the surface and increases in the direction of thickness.

In the configuration, the absorption of the excimer light becomes effective at the deep position where the element ratio of carbon is continuously increased in comparison with the absorption of the excimer light in the surface where the element ratio of carbon is small. Namely, the irradiation with the excimer light from the surface toward the depth direction becomes effective. Since the absorption at the deep position is effective, the modification treatment at the deep position of the silicon compound is easily progressed.

In contrast to this, when the composition is uniform in the direction of thickness, that is, the element ratio of carbon is uniform in the direction of thickness, the absorption of the excimer light to be absorbed by Si—C is large in the surface. Furthermore, since the active oxygen and the like produced by the irradiation with the excimer light is consumed in the silicon compound provided directly therebelow, the modification treatment is less likely to be progressed in the depth direction.

Furthermore, when the change in composition is not uniform, there exists locally a high concentration portion and a low concentration portion in the depth direction. When the element ratio of carbon is locally high, the absorption of the excimer light is concentrated on the high portion. Therefore, the modification is concentrated on the portion having a high element ratio, and thus the modification is less likely to be progressed in the surrounding portions. In the portion where the element ratio of carbon is locally low, the chain modification from the surface is likely to be terminated, and .pth direction becomes less likely to be progressed. Accordingly, if there is a local change in element ratio, the modification of the silicon compound in the depth direction becomes less likely to be progressed.

(Plasma Treatment)

A known method can be used for a plasma treatment used for the surface treatment of the silicon compound, and an atmospheric pressure plasma treatment. In the case of the atmospheric pressure plasma treatment, nitrogen gas and/or atoms in Group XVIII in the periodic table, specifically, helium, neon, argon, krypton, xenon, radon or the like is used as a discharge gas. Among these, nitrogen, helium and argon is used, and in particular, nitrogen is low in cost.

As an example of the plasma treatment, the atmospheric pressure plasma treatment will be explained. Specifically, the atmospheric pressure plasma is one, as described in International Publication No. WO 2007/026545, in which two or more electric fields of different frequencies are formed in a discharge space, and an electric field in which a first radio frequency electric field and a second radio frequency electric field are superposed is formed.

In the atmospheric pressure plasma treatment, a frequency $\omega_2$ of the second radio frequency electric field is higher than a frequency $\omega_1$ of the first radio frequency electric field, the relationship among an intensity V1 of the first radio frequency electric field, an intensity V2 of the second radio frequency electric field and an intensity IV of an discharge starting electric field satisfies $$V1 \geq IV > V2 \text{ or } V1 > IV \geq V2$$

and the output density of the second radio frequency electric field is 1 W/cm² or more.

For example, even in the case of discharge gas having a high discharge starting electric field intensity such as nitrogen gas, it is possible to start discharge, to maintain a plasma state with high density and stability, and to form a thin film of high performance, by adopting such discharge conditions.

According to the above measurement, when setting nitrogen gas as a discharge gas, the discharge starting electric field intensity IV (½Vp-p) is approximately 3.7 kV/mm, and accordingly, in the above-described relationship, it is possible to excite the nitrogen gas and to make the nitrogen gas into a plasma state, by applying a first applied electric field intensity as V1≥3.7 kV/mm.

Here, as to the frequency of a first power source, 200 kHz or less can be used. In addition, as to the waveform of the electric field, both a continuous wave and a pulse wave are usable. The lower limit is desirably approximately 1 kHz.

On the other hand, as the frequency of a second power source, 800 kHz or more can be used. A higher frequency of the second power source gives a higher plasma density to thereby give a dense and high-quality thin film. The upper limit is desirably approximately 200 kHz.

The formation of radio frequency electric fields from such two power sources is necessary for starting discharge of a discharge gas having a high discharge starting electric field intensity by the first radio frequency electric field, and the plasma density can be made high and a dense and high-quality thin film can be formed by a high frequency and high output density of the second radio frequency electric field.

(Ultraviolet Ray Irradiation Treatment)

A treatment by ultraviolet ray irradiation is also as the surface treatment of the silicon compound. Ozone and active oxygen atoms generated by ultraviolet ray (the same meaning as ultraviolet light) has a high oxidation capability, and a silicon oxide film or a silicon oxynitride film having high denseness and insulation performance at low temperatures can be produced.

The base material is heated by the ultraviolet ray irradiation, and $O_2$ and $H_2O$ contributing to ceramic formation (silica conversion), an ultraviolet absorber, and the silicon compound itself are excited and activated, and thus the surface of the silicon compound becomes hydrophilic.

The method according embodiments may be used in any commonly used ultraviolet ray generation apparatus.

Note that, in the present example, "ultraviolet ray" generally means an electromagnetic wave having a wavelength of 10 to 400 nm, and in the case of the ultraviolet ray irradiation treatment except for a vacuum ultraviolet ray (10 to 200 nm) treatment to be described later, ultraviolet rays of 210 to 350 nm are used.

In the ultraviolet ray irradiation, an irradiation intensity and irradiation time are set within a range not damaging the base material holding a coated film to be irradiated.

When taking, as an example, the case where a plastic film is used as the base material, it is possible to set the distance between the base material—lamp so that the intensity on the base material surface becomes 20 to 300 mW/cm², 50 to 200 mW/cm² for 0.1 sec to 10 min by, for example, using a lamp of 2 kW (80 W/cm×25 cm), and to perform the irradiation for 0.1 sec to 10 min.

Generally, when the base material temperature at the time of the ultraviolet ray irradiation treatment becomes 150° C. or more, damage of the base material such as the deformation or strength degradation of the base material is carried out in the case of a plastic film or the like. However, in the case of a film having high heat resistance such as polyimide and a substrate of metal or the like, a treatment at higher temperatures is possible. Accordingly, there is no general upper limit on the base material temperature at the time of the ultraviolet ray irradiation, and a person skilled in the art can suitably set the base material temperature depending on kinds of the base materials. Furthermore, an ultraviolet ray irradiation atmosphere is not particularly limited and the ultraviolet ray irradiation may be performed in the air.

Examples of generation methods of the ultraviolet ray include metal halide lamp, high-pressure mercury vapor lamp, low-pressure mercury vapor lamp, xenon arc lamp, carbon arc lamp, excimer lamp (single wavelength of 172 nm, 222 nm, 308 nm, for example, manufactured by Ushio, Inc.), UV lasers, and the like, but the generation methods are not particularly limited. Furthermore, in irradiating a polysilazane coated film with the generated ultraviolet ray, the coated film is desirably irradiated with the ultraviolet ray from a generation source, reflected from a reflection plate, also in order to achieve uniform irradiation for improving the efficiency.

The ultraviolet ray irradiation is applicable to both a batch treatment and a continuous treatment, and an appropriate selection is possible depending on shapes of coated base materials. For example, in the case of a batch treatment, a base material having a polysilazane-coated film on the surface (for example, silicon wafer) can be treated with a burning furnace provided with the ultraviolet ray generation source. The ultraviolet ray burning furnace itself is generally known, and for example, one manufactured by EYE GRAPHICS CO., LTD. can be used. Furthermore, when a base material having a polysilazane-coated film on the surface is in a shape of long film, the formation into ceramic can be performed by a drying zone provided with such ultraviolet ray generation source as described above continuously irradiating the long film with ultraviolet rays while conveying the long film. A time period necessary for the ultraviolet ray irradiation is generally from 0.1 sec to 10 min, 0.5 sec to 3 min, although the time period depends on a base material to be coated, a composition or concentration of the coating composition.

(Vacuum Ultraviolet Ray Irradiation Treatment; Excimer Irradiation Treatment)

A treatment by vacuum ultraviolet ray irradiation is included as a further surface treatment of the silicon compound. The treatment by vacuum ultraviolet ray irradiation is a method in which, through the use of an optical energy of 100 to 200 nm lager than the inter-atomic bonding strength in the silicon compound, through the use of an energy of light having a wavelength of 100 to 180 nm, a surface treatment is performed at relatively low temperatures by advancing an oxidation reaction using active oxygen or ozone while directly cutting the bonding of atoms by an action only of photons referred to as a photon process.

An inert gas excimer lamp is used as a vacuum ultraviolet light source necessary for this.

(Excimer Light Emission)

A rare gas atom such as Xe, Kr, Ar, or Ne does not form a molecule through chemical bonding, such a rare gas is referred to as an inert gas. However, atoms of an inert gas having obtained an energy by discharge or the like (excited atom) can be bonded to another atom to thereby form a molecule. When an inert gas is xenon, the reaction is as follows:

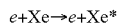

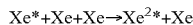

and when Xe$^2$* being an excited excimer molecule transitions to the ground state, it emits excimer light of 172 nm. The characteristics of an excimer lamp include having a high efficiency because the emission is concentrated on one wavelength and light other than required light is almost not emitted.

Furthermore, since no excessive light is emitted, the temperature of an object can be kept low. Moreover, since no time is required for starting and re-starting, instantaneous lighting and blinking are possible.

A method of using dielectric barrier discharge is known in order to obtain excimer emission. The dielectric barrier discharge is discharge referred to as micro discharge that is generated in the gas space, by providing a gas space between both electrodes via a dielectric substance (transparent quartz in the case of an excimer lamp) and applying a high-frequency high voltage of several 10 kHz to the electrode, and that is like very thin thunder. When the streamer of the micro discharge reaches a tube wall (dielectric substance), charges accumulate on the surface of the dielectric substance, and thus the micro discharge is extinguished. In this way, the dielectric barrier discharge is discharge in which the micro discharge spreads over the whole of the tube wall and repeats the generation and extinction. Therefore, flickering of the light that can be recognized with the naked eye arises. Additionally, since streamer at a very high temperature reaches locally and directly the tube wall, deterioration of the tube wall may be accelerated.

Electrodeless electric field discharge is also possible in addition to the dielectric barrier discharge, as a method for effectively obtaining excimer emission. The electrodeless electric field discharge is one based on capacitive coupling and is referred to as RF discharge as a byname. Basically, the same lamp and electrode and the arrangement thereof as those in the dielectric barrier discharge are acceptable, and radio frequency to be applied to both electrodes is lit at several MHz. In the electrodeless electric field discharge, since spatially and temporally uniform discharge is obtained as described above, a lamp free of flickering of light and has a long life time can be obtained.

In the case of the dielectric barrier discharge, since the micro discharge is generated only between electrodes, an outside electrode covers the whole outer surface and has to be one that allows light to pass through for the purpose of extracting the light to the outside, in order to generate discharge in the whole discharge space. For that purpose, an electrode obtained by forming a thin metal into a net-like shape is used. Since a wire as thin as possible is used for the electrode so as not to shield light, the electrode is easily damaged by ozone and the like generated by vacuum ultraviolet light, in an oxygen atmosphere.

In order to prevent this, there is generated the necessity of setting the circumference of the lamp, namely, the inside of the irradiation apparatus to be an atmosphere of inert gas such as nitrogen and of providing a window of synthesized quartz to extract irradiation right.

The window of synthesized quartz is not only an expensive consumable article, but also generates loss of light.

Since a double cylindrical type lamp has an outer diameter of approximately 25 mm, the difference in distances to an irradiation surface between directly below a lamp axis and a lamp side surface cannot be neglected and a large difference in illuminance arises. Accordingly, even if lamps are aligned in close contact, uniform illuminance distribution cannot be obtained. When an irradiation apparatus provided with a window of synthesized quartz is used, the distance in an oxygen atmosphere can be made uniform and uniform illuminance distribution is obtained.

When the electrodeless electric field discharge is used, the outside electrode is not required to be in a net shape. Glow discharge spreads over the whole discharge space only by providing the outside electrode on a part of the lamp outer surface. An electrode usually formed of an aluminum block and doubling also as a reflection plate of light is used as the outside electrode on the rear face of the lamp. However, since the lamp outer diameter is large as in the case for the dielectric barrier discharge, synthesized quartz becomes necessary in order to make the illumination distribution uniform.

The greatest feature of a thin tube excimer lamp is a simple structure thereof. The structure is only such that both ends of a quartz tube are closed and gas for performing excimer emission is sealed inside. Accordingly, a very inexpensive light source can be provided.

In the double cylindrical type lamp, since processing of connecting and closing the both ends of inner and outer tubes has been performed, the lamp tends to be damaged in handling or transportation as compared with the thin tube lamp. Furthermore, the outer diameter of the tube of the thin tube lamp is approximately 6 to 12 mm, and when the tube is too thick, a high voltage is required for the starting.

The form of discharge can be used for both the dielectric barrier discharge and the electrodeless electric field discharge. As to the shape of the electrode, the plane to be in contact with a lamp may be flat, but when the shape is made in accordance with a curved plane of the lamp, discharge is made more stable since the lamp can be firmly fixed firmly and the electrode closely adheres to the lamp. In addition, when the curved surface is made into a mirror surface by using aluminum, the curved surface also serves as a reflection plate of light.

A xenon excimer lamp emits an ultraviolet ray having a short wavelength of 172 nm at a single wavelength, and is excellent in emission efficiency. Since the light represents a large absorption coefficient for oxygen, the light can generate radical oxygen atom species or ozone with a small amount of oxygen. Furthermore, it is known that the energy of light of short wavelength of 172 nm that dissociates the bonding of an organic material has high performance. The modification of the polysilazane-containing layer can be realized in a short period of time, by the active oxygen or ozone, and a high energy of the ultraviolet ray irradiation. Accordingly, as compared with a low-pressure mercury vapor lamp that emits wavelengths of 185 nm and 254 nm, and plasma cleaning, it is made possible to shorten a process time along high throughput, reduce the area of facilities, and to irradiate an organic material, a plastic substrate and the like which are susceptible to damage by heat.

The excimer lamp has high light generation efficiency and can be lit by inputting low electric power. Furthermore, the excimer lamp is characterized in that light of a long wavelength that is a cause of temperature rise by light is not emitted, and since irradiation with energy having a single wavelength in an ultraviolet ray region is performed, the increase in the surface temperature of an irradiation object is suppressed. Therefore, the excimer lamp is suitable for a flexible film material such as PET that is considered to be susceptible to the influence of heat.

(Distribution Curve of Element)

The vapor deposition layer 12 is configured by the silicon compound containing at least one element selected from C, N and O, and has a construction in which contents of C, N and O changes continuously. Additionally, the vapor deposition layer 12 has a feature in a distribution curve showing the relationship between the distance from the surface of the vapor deposition layer 12 (the interface with the polysilazane modified layer 13 side) in the film direction of thickness and the ratio of the atom amount (an atom ratio) of respective elements (silicon, carbon, nitrogen or oxygen).

Note that the atom ratio of each element is represented by the ratio of silicon, carbon, nitrogen or oxygen to the total amount of respective elements of silicon, carbon, nitrogen and oxygen [(Si, O, C, N)/(Si+O+C+N)].

A silicon distribution curve, a carbon distribution curve, a nitrogen distribution curve and an oxygen distribution curve represent the atom ratio of silicon, the atom ratio of oxygen, the atom ratio of carbon, and the atom ratio of nitrogen at distances from the surface of the vapor deposition layer 12, respectively.

Furthermore, a distribution curve representing the relationship between the distance from the surface of the vapor deposition layer 12 (the interface on the polysilazane modified layer 13 side) in the direction of thickness and the ratio between total atomic weight of oxygen and carbon (atom ratio) is defined as an oxygen carbon distribution curve.

The refractive index distribution in the vapor deposition layer 12 can be controlled by the carbon amount and the oxygen amount in the direction of thickness of the vapor deposition layer 12.

Figure 2:
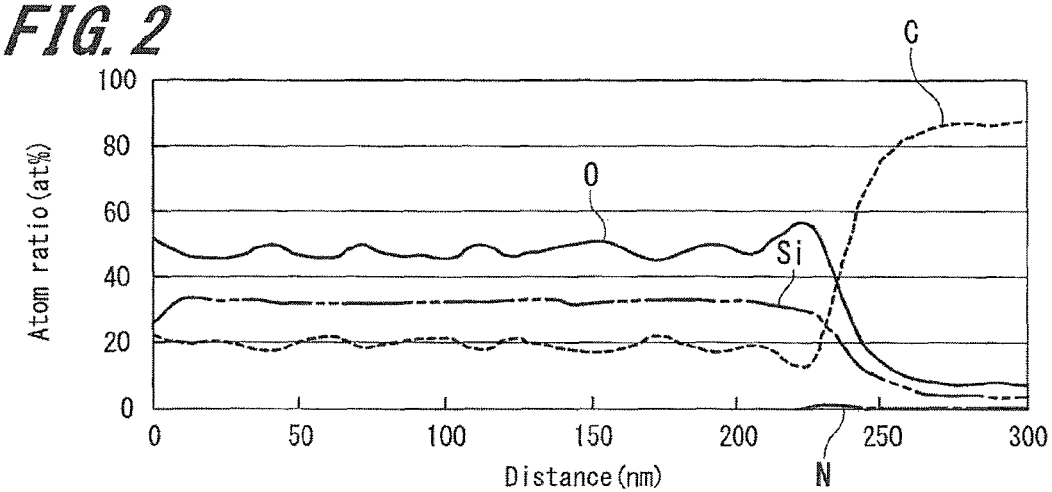
FIG. 2 is a graph showing a distribution curve of silicon, a distribution curve of oxygen and a distribution curve of carbon.
Figure 3:
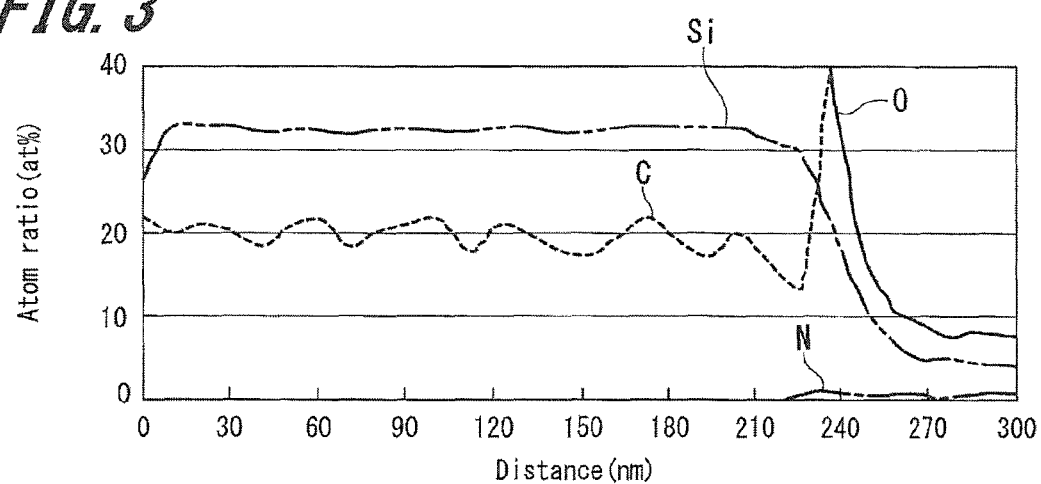
FIG. 3 is an enlarged view of the distribution curve of carbon illustrated in FIG. 2.

In FIG. 2, examples of the silicon distribution curve, the oxygen distribution curve, the carbon distribution curve and the nitrogen distribution curve of the vapor deposition layer 12 are shown. Additionally, in FIG. 3, the carbon distribution curve is shown on a larger scale among the silicon distribution curve, the oxygen distribution curve, the carbon distribution curve and the nitrogen distribution curve shown in FIG. 2. In FIGS. 2 and 3, the horizontal axis represents the distance [nm] from the surface of the vapor deposition layer 12 in the direction of thickness. In addition, the vertical axis represents the atom ratio [at %] of each of silicon, oxygen, carbon or nitrogen to the total amount of each element of silicon, oxygen and carbon.

Note that details of a method for measuring the silicon distribution curve, the oxygen distribution curve, the carbon distribution curve and the nitrogen distribution curve will be described later.

As shown in FIG. 2, atom ratios of the silicon, oxygen, carbon and nitrogen change depending on the distance from the surface of the vapor deposition layer 12. In particular, as to the oxygen and carbon, the variation of the atom ratio is large corresponding to the distance from the surface of the vapor deposition layer 12, and each of the distribution curves has a plurality of extreme values. Furthermore, the oxygen distribution curve and the carbon distribution curve have a correlation, and the atom ratio of oxygen is small at distances where the atom ratio of carbon is large, and the atom ratio of oxygen is large at distances where the atom ratio of carbon is small.

The change in composition of the silicon compound is defined by the change of the distribution curve of arbitrary one kind of the element contained in the silicon compound and selected from C, N, and O. Therefore, since the silicon compound constituting the vapor deposition layer 12 is changed in its composition in an inclined manner in the direction of thickness, the distribution curve of the arbitrary one kind of the element contained in the silicon compound and selected from C, N, and O also has the continuous change in composition in an inclined manner.

Accordingly, in the silicon compound constituting the vapor deposition layer 12, the distribution curve (atom ratio) of anyone of the element contained in the above silicon compound is changed at the region of 30 nm depth from the surface by 5% or more, more 10% or more. Particularly, the distribution curve is changed at the region of 15 nm depth from the surface by 5% or more, more 10% or more.

(Relation Between Distribution Curve of Element and Distribution of Refractive Index)

As described above, since the vapor deposition layer 12 has the change in composition in an inclined manner in the direction of thickness, the vapor deposition layer has a distribution of refractive index in the direction of thickness depending on the change in composition. The vapor deposition layer 12 has at least one extreme value in the distribution of refractive index.

Figure 4:
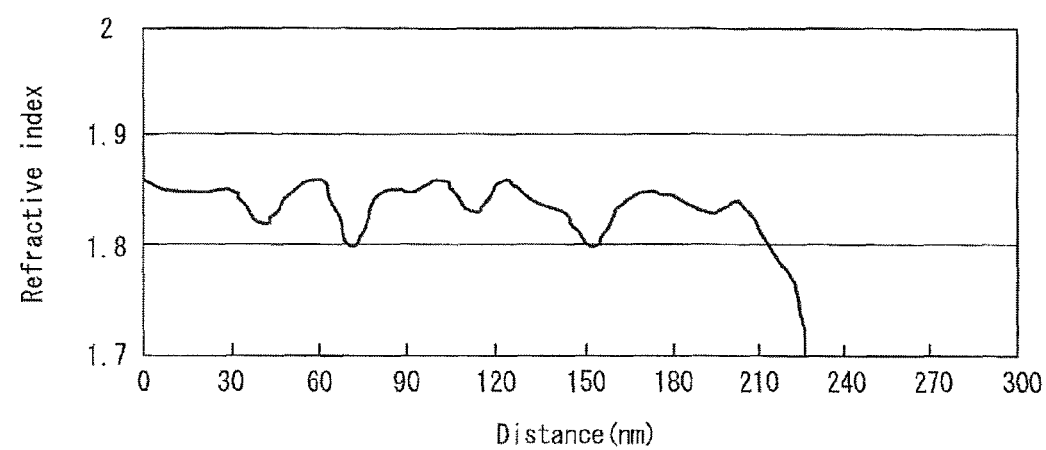
FIG. 4 is a graph illustrating a distribution of refractive index of a vapor deposition layer.

FIG. 4 shows the distribution of refractive index of the vapor deposition layer 12. In FIG. 4, the horizontal axis shows a distance [nm] from the surface of the vapor deposition layer 12 in the direction of thickness. The vertical axis shows a refractive index of the vapor deposition layer 12. The refractive index of the vapor deposition layer 12 shown in FIG. 4 is a value of the refractive index of the vapor deposition layer 12 relative to the visual light measured at a distance from the surface of the vapor deposition layer 12 in the direction of thickness. The refractive index of the vapor deposition layer 12 can be measured by a known method, for example, by using a spectrum ellipsometer (ELC-300 manufactured by JASCO Corporation), and the like.

As shown in FIGS. 3 and 4, there is interrelation between the ratio of carbon and the refractive index of the vapor deposition layer 12. In the vapor deposition layer 12, the refractive index of the vapor deposition layer 12 increases at the position where the ratio of carbon increases. Therefore, the refractive index of the vapor deposition layer 12 changes in accordance with the ratio of carbon. Namely, in the vapor deposition layer 12, the distribution curve of the refractive index of the vapor deposition layer 12 can be controlled by adjusting the distribution of atom ratio of carbon in the direction of thickness.

Furthermore, as described above, since there is also in correlation between the atom ratio of carbon and the atom ratio of oxygen, the distribution curve of the refractive index of the vapor deposition layer 12 can be controlled by controlling the atom ratio and the distribution curve of oxygen.

Reflection and interference which take place on the interface of the base material 11 can be suppressed by providing with the vapor deposition layer 12 having an extreme value in the distribution of the refractive index. Therefore, the light transmitted through the gas barrier film 10 exits by the action of the vapor deposition layer 12 without any influence of total reflection and interference. Accordingly, the light amount is not lowered, and thus an efficiency of the taking out of the light from the gas barrier film 10 is enhanced.

(Conditions of Distribution Curves of Respective Elements)

In the vapor deposition layer 12, in addition to the continuous change in composition as described above, the atom ratios of the silicon, oxygen and carbon, or distribution curves of respective elements satisfy conditions of (i) to (iii) below.

(i) The atom ratio of silicon, the atom ratio of oxygen and the atom ratio of carbon satisfy a condition represented by a formula (1) below in regions of 90% or more of the thickness of the vapor deposition layer 12.

(the atom ratio of oxygen)>(the atom ratio of silicon)>(the atom ratio of carbon)     (1)

Alternatively, the atom ratio of silicon, the atom ratio of oxygen and the atom ratio of carbon satisfy a condition represented by a formula (2) below in regions of 90% or more of the thickness of the vapor deposition layer 12.

(the atom ratio of carbon)>(the atom ratio of silicon)>(the atom ratio of oxygen)     (2)

(ii) The carbon distribution curve has at least one maximum value and minimum value.

(iii) The absolute value of the difference between the maximum value and the minimum value of the atom ratios of carbon in the carbon distribution curve is 5 at % or more.

The gas barrier film 10 has the vapor deposition layer 12 which satisfies all of the above-described conditions (i) to (iii). Further, the film may have two or more vapor deposition layers 12 which satisfy all of the above-described conditions (i) to (iii). When providing with two or more vapor deposition layers 12, the qualities of a plural of the vapor deposition layers may be the same or different. When providing with two or more vapor deposition layers 12, the vapor deposition layers 12 may be formed on one surface of the base material 11, or may be formed on the surfaces of both sides of the base material 11.

The refractive index of the vapor deposition layer 12 can be controlled by the atom ratio of carbon or oxygen, as the above-described correlation shown in FIGS. 3 and 4. Therefore, according to the conditions (i) to (iii), the refractive index of the vapor deposition layer 12 can be adjusted within a range.

(Carbon Distribution Curve)

It is necessary that, the carbon distribution curve has at least one extreme value in the vapor deposition layer 12. In the vapor deposition layer 12, more the carbon distribution curve has at least two extreme values, particularly at least three extreme values. Furthermore, the carbon distribution curve has as least one maximum value and one minimum value.

When the carbon distribution curve does not have the extreme value, obtained light distribution properties of the vapor deposition layer 12 become insufficient. Therefore, the elimination of the angle dependency of light from the gas barrier film 10 becomes difficult.

Furthermore, when the vapor deposition layer 12 has three or more extreme values, in one extreme value of the carbon distribution curve and another extreme value adjacent to the extreme value, the difference in distances from the surface of the vapor deposition layer 12 in the direction of thickness is 200 nm or less, more 100 nm or less.

(Extreme Value)

In the vapor deposition layer 12, the extreme value of the distribution curve is the maximum value or the minimum value of the atom ratio of an element relative to the distance from the surface of the vapor deposition layer 12 in the direction of thickness of the vapor deposition layer 12, or the measurement value corresponding to the value in the refractive index distribution curve.

In the vapor deposition layer 12, the maximum value of the distribution curve of each element is a point at which the value of the atom ratio of an element changes from the decrease to the increase when the distance from the surface of the vapor deposition layer 12 is changed. Additionally, the point is a point at which the decrease in the value of the atom ratio of the element is 3 at % or more at a position where the change of 20 nm in the distance from the surface of the vapor deposition layer 12 is further made from the point.

In the vapor deposition layer 12, the minimum value of the distribution curve of each element is a point at which the value of the atom ratio of an element changes from the decrease to the increase when the distance from the surface of the vapor deposition layer 12 is changed. Additionally, the point is a point at which the increase in the value of the atom ratio of the element is 3 at % or more at a position where the change of 20 nm in the distance from the surface of the vapor deposition layer 12 is further made from the point.

Furthermore, in the carbon distribution curve of the vapor deposition layer 12, the absolute value of the difference between the maximum value and the minimum value of the atom ratios of carbon is 5 at % or more. In addition, in the vapor deposition layer 12, the absolute value of the difference between the maximum value and the minimum value of the atom ratios of carbon is more 6 at % or more, further 7 at % or more. When the difference between the maximum value and the minimum value of the atom ratios of carbon is less than the above-described range, the difference in refractive indices in the refractive index distribution curve of the obtained vapor deposition layer 12 becomes small, and light distribution properties become insufficient.

There is correlation between the carbon distribution quantity and the refractive index, and when the absolute value between the maximum value and the minimum value of carbon atoms is 7 at % or more, the absolute value of the obtained difference between the maximum value and the minimum value of refractive indices becomes 0.2 or more.

(Oxygen Distribution Curve)

In the vapor deposition layer 12, the oxygen distribution curve has at least one extreme value. In particular, in the vapor deposition layer 12, the oxygen distribution curve has more at least two extreme values, further at least three extreme values. Moreover, the oxygen distribution curve has at least one maximum value and one minimum value.

When the oxygen distribution curve does not have the extreme value, obtained light distribution properties of the vapor deposition layer 12 become insufficient. Therefore, the elimination of the angle dependency of light from the gas barrier film 10 becomes difficult.

Furthermore, when the vapor deposition layer 12 has three or more extreme values, in one extreme value of the oxygen distribution curve and another extreme value adjacent to the extreme value, the difference in distances from the surface of the vapor deposition layer 12 in the direction of thickness is 200 nm or less, more 100 nm or less.

In addition, in the oxygen distribution curve of the vapor deposition layer 12, the absolute value of the difference between the maximum value and the minimum value of the atom ratios of oxygen is 5 at % or more. Additionally, in the vapor deposition layer 12, the absolute value of the difference between the maximum value and the minimum value of the atom ratios of oxygen is more 6 at % or more, further 7 at % or more. When the difference between the maximum value and the minimum value of the atom ratios of oxygen is less than the above-described range, light distribution properties become insufficient from the obtained refractive index distribution curve of the vapor deposition layer 12.

(Silicon Distribution Curve)

In the silicon distribution curve of the vapor deposition layer 12, the absolute value of the difference between the maximum value and the minimum value of the atom ratios of silicon is less than 5 at %. Furthermore, in the vapor deposition layer 12, the absolute value of the difference between the maximum value and the minimum value of the atom ratios of silicon is more less than 4 at %, further less than 3 at %. When the difference between the maximum value and the minimum value of the atom ratios of silicon is not less than the above-described range, light distribution properties become insufficient from the obtained refractive index distribution curve of the vapor deposition layer 12.

(Total Amount of Oxygen and Carbon: Oxygen-Carbon Distribution Curve)

In addition, in the vapor deposition layer 12, the ratio of the total amount of the oxygen atom and carbon atom to the total amount of the silicon atom, oxygen atom and carbon atom is defined as an oxygen-carbon distribution curve.

In the vapor deposition layer 12, the absolute value of the difference between the maximum value and the minimum value of the total atom ratios of oxygen and carbon in the oxygen carbon distribution curve is less than 5 at %, less than 4 at %, and less than 3 at %.

When the difference between the maximum value and the minimum value of the total atom ratios of oxygen and carbon is no less than the above-described range, light distribution properties become insufficient from the obtained refractive index distribution curve of the vapor deposition layer 12.

(XPS Depth Profile)

The above-described silicon distribution curve, oxygen distribution curve, carbon distribution curve, oxygen-carbon distribution curve and nitrogen distribution curve can be produced by an XPS depth profile measurement, in which, by simultaneously using the measurement of X-ray Photoelectron Spectroscopy (XPS) and ion sputtering of inert gas such as argon, surface composition analysis is sequentially performed while exposing the inside of a sample. Distribution curves obtained by the XPS depth profile measurement can be produced while setting, for example, the vertical axis as the atom ratio (unit: at %) of each element and the horizontal axis as etching time (sputtering time).

Note that, in a distribution curve of an element setting the horizontal axis as etching time, the etching time generally correlates with the distance from the surface of the vapor deposition layer 12 in the direction of thickness. Therefore, in performing the XPS depth profile measurement, the distance from the surface of the vapor deposition layer 12 calculated from the relation between etching rate and the etching time can be adopted as "the distance from the surface of the vapor deposition layer 12 in the direction of thickness."

In the XPS depth profile measurement, an inert gas ion sputtering method using argon ($Ar^+$) as etching ion species is adopted and an etching speed (etching rate) is set to be 0.05 nm/sec (in terms of $SiO_2$ thermally oxidized film).

From the viewpoint that the vapor deposition layer 12 is to be formed as a layer having uniform and excellent light distribution properties in the whole film face, the vapor deposition layer 12 is substantially uniform in the film surface direction (the direction parallel to the surface of the vapor deposition layer 12). The fact that the vapor deposition layer 12 is substantially uniform in the film surface direction means that numbers of the extreme values of the distribution curves of an element in each of measurement positions are the same in any two positions of the film face of the vapor deposition layer 12, and means that absolute values of differences between the maximum value and the minimum value of the atom ratios of carbon in distribution curves are equal to each other or the difference between the maximum value and the minimum value is within 5 at %.

(Silicon Atom Ratio, Oxygen Atom Ratio)

Furthermore, in the silicon distribution curve, the oxygen distribution curve and the carbon distribution curve, the atom ratio of the silicon, the atom ratio of the oxygen and the atom ratio of the carbon satisfy the condition represented by the above-described formula (1) in regions of 90% or more of the thickness of the vapor deposition layer 12. In this case, the atom ratio of the content of the silicon atom to the total amount of the silicon atom, the oxygen atom and the carbon atom in the vapor deposition layer 12 is 25 to 45 at %, 30 to 40 at %.

Additionally, the atom ratio of the content of the oxygen atom relative to the total amount of the silicon atom, the oxygen atom and the carbon atom in the vapor deposition layer 12 is 33 to 67 at %, or 45 to 67 at %.

Moreover, the atom ratio of the content of the carbon atom relative to the total amount of the silicon atom, the oxygen atom and the carbon atom in the vapor deposition layer 12 is 3 to 33 at o, or 3 to 25 at %.

(Thickness of Vapor Deposition Layer)

The thickness of the vapor deposition layer 12 is within a range of 5 to 3000 nm, within a range of 10 to 2000 nm, and or within a range of 100 to 1000 nm. When the thickness of the vapor deposition layer 12 is outside the range, light distribution properties of the vapor deposition layer 12 become insufficient.

Furthermore, when forming a plurality of the vapor deposition layer 12, the total thickness of the vapor deposition layer 12 is within a range of 10 to 10000 nm, in a range of 10 to 5000 nm, within a range of 100 to 3000 nm, or within a range of 200 to 2000 nm.

(Primer Layer)

A primer coat layer, a heat-sealable resin layer, an adhesive agent layer or the like may be provided between the vapor deposition layer 12 and the base material 11. The primer coat layer can be formed using a known primer coat agent capable of enhancing the adhesiveness between the base material 11 and the vapor deposition layer 12. Furthermore, the heat-sealable resin layer can be formed appropriately using a known heat-sealable resin. Moreover, the adhesive agent layer can be formed appropriately using a known adhesive agent, and a plurality of vapor deposition layer 12 may be caused to adhere to such an adhesive agent layer.

(Method for Producing Vapor Deposition Layer)

In the gas barrier film 10, the vapor deposition layer 12 is a layer formed by a plasma chemical vapor deposition method (plasma CVD, PECVD). The vapor deposition layer 12 formed by a plasma chemical vapor deposition method is a layer formed by a plasma chemical vapor deposition method (plasma CVD) in which the base material 11 is disposed on a pair of film-forming rolls, and discharge is performed between the pair of film-forming rolls to thereby generate plasma. The plasma chemical vapor deposition method may be a plasma chemical vapor deposition method of a Penning discharge plasma system. In addition, when discharge is performed between the pair of film-forming rolls, polarities of the pair of film-forming rolls are alternately reversed.

In generating plasma in the plasma chemical vapor deposition method, a plasma discharge in a space among a plurality of film-forming rolls is generated. In particular, plasma is generated by using a pair of film-forming rolls, disposing the base material 11 on each of the pair of film-forming rolls, and performing discharge between the pair of film-forming rolls.

In this way, a film can be formed on the base material 11 existing on one film-forming roll by disposing the base material 11 on the pair of film-forming rolls and performing discharge between the film-forming rolls. At the same time, a film can also be formed on the base material 11 on another film-forming roll. Therefore, a film formation rate can be doubled and a thin film can be effectively manufactured. Furthermore, films of the same structure can be formed on each of the base materials 11 on the pair of film-forming rolls.

In addition, the use of a film-forming gas containing an organic silicon compound and oxygen for the plasma chemical vapor deposition method. The content of oxygen in the film-forming gas is not more than a theoretical oxygen amount required for completely oxidizing the total amount of the organic silicon compound in the film-forming gas.

The vapor deposition layer 12 is a layer formed by a continuous film formation process.

(Production Apparatus of Vapor Deposition Layer)

The vapor deposition layer 12 is, as described above, formed on the surface of the base material 11 by a roll-to-roll system from the viewpoint of productivity, as described above. An apparatus capable of producing the vapor deposition layer 12 by the plasma chemical vapor deposition method is, although not particularly limited, an apparatus that includes at least a pair of film-forming rolls and a plasma power source, and that has a configuration capable of performing discharge between the film-forming rolls.

Figure 5:
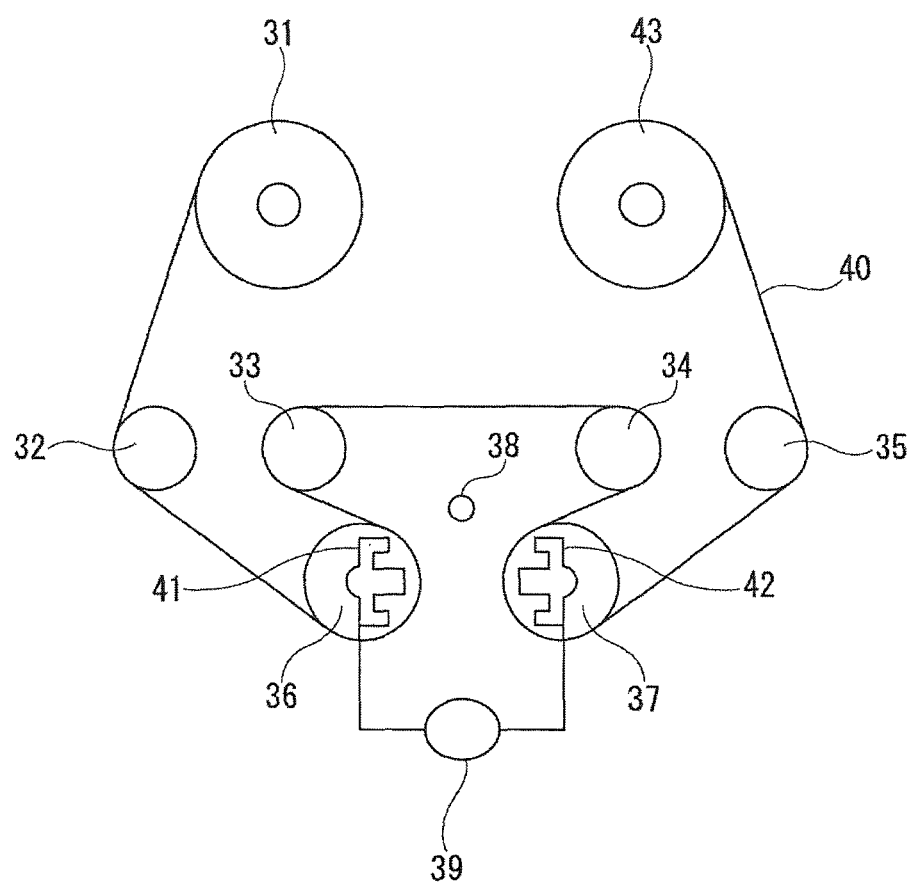
FIG. 5 is a view illustrating a configuration of a production apparatus of the vapor deposition layer.

For example, when a production apparatus 30 shown in FIG. 5 is used, production by a roll-to-roll system while utilizing the plasma chemical vapor deposition method becomes possible. Hereinafter, a method for producing the vapor deposition layer 12 will be explained while referring to FIG. 5. Note that FIG. 5 is a schematic view showing an example of a production apparatus suitable for producing the vapor deposition layer 12.

The production apparatus 30 shown in FIG. 5 includes a feeding roll 31, conveyance rolls 32, 33, 34 and 35, film-forming rolls 36 and 37, a gas supply pipe 38, a power source for plasma generation 39, magnetic field-generating devices 41 and 42 installed inside the film-forming rolls 36 and 37, and a winding roll 43. In addition, in the production apparatus 30, at least the film-forming rolls 36 and 37, the gas supply pipe 38, the power source for plasma generation 39, and the magnetic field-generating devices 41 and 42 are disposed in a vacuum chamber not illustrated. Furthermore, in the production apparatus 30, the vacuum chamber is connected to a vacuum pump whose illustration is omitted, and the adjustment of pressure in the vacuum chamber is made possible by the vacuum pump.

In the production apparatus 30, the respective film-forming rolls are connected respectively to the power source for plasma generation 39 so as to be able to cause the pair of film-forming rolls (the film-forming roll 36 and the film-forming roll 37) to function as a pair of counter electrodes. Therefore, in the production apparatus 30, discharge in the space between the film-forming roll 36 and the film-forming roll 37 is possible by supplying electric power from the power source for plasma generation 39, and plasma can be generated in the space between the film-forming roll 36 and the film-forming roll 37. Note that, when the film-forming roll 36 and the film-forming roll 37 are to be utilized as electrodes, it is sufficient that the quality of the material or design of the film-forming roll 36 and the film-forming roll 37 is changed so that the film-forming roll 36 and the film-forming roll 37 may also be utilized as electrodes. Furthermore, in the production apparatus 30, the pair of film-forming rolls (film-forming rolls 36 and 37) are disposed so that center axes become approximately parallel on the same plane. In this way, the film formation rate can be doubled, and in addition, films of the same structure can be formed, by disposing the pair of film-forming rolls (film-forming rolls 36 and 37). Therefore, it becomes possible at least to double the extreme value in the carbon distribution curve. Additionally, according to the production apparatus 30, the formation of the vapor deposition layer 12 on the surface of a film 40 by a CVD method is possible, and furthermore, film components can be deposited on the surface of the film 40 also on the film-forming roll 37 while depositing film components on the surface of the film 40 on the film-forming roll 36, and thus the vapor deposition layer 12 can be effectively formed on the surface of the film 40.

In addition, magnetic field-generating devices 41 and 42, which are fixed so as not to rotate even when the film-forming roll rotates, are provided respectively inside the film-forming roll 36 and the film-forming roll 37.

Furthermore, a known roll can be used as the film-forming roll 36 and the film-forming roll 37. From the viewpoint of forming a thin film more effectively, the use of rolls having the same diameter as the film-forming rolls 36 and 37. Diameters of the film-forming rolls 36 and 37 are set within a range of 5 to 100 cm, from the viewpoint of discharge conditions, the space of the chamber and the like.

Moreover, in the production apparatus 30, the film 40 is disposed on the pair of film-forming rolls (the film-forming roll 36 and the film-forming roll 37) so that surfaces of the film 40 face each other. By disposing the film 40 in this way, it becomes possible to simultaneously form the vapor deposition layer 12 on respective surfaces of the film 40 existing between the pair of film-forming rolls, in generating plasma by performing discharge between the film-forming roll 36 and the film-forming roll 37. Namely, according to the production apparatus 30, film components can be deposited on the surface of the film 40 on the film-forming roll 36 and furthermore, film components can be deposited on the film-forming roll 37, by a CVD method, and thus, an effective formation of the vapor deposition layer 12 on the surface of the film 40 becomes possible.

In addition, known rolls can be used as the feeding roll 31 and the conveyance rolls 32, 33, 34 and 35 for use in the production apparatus 30. Furthermore, it is sufficient that the winding roll 43 can wind the film 40 on which the vapor deposition layer 12 has been formed, and no particular limitation is imposed on the winding roll 43, and also a known roll can be used as the winding roll 43.

Furthermore, piping capable of supplying or exhausting raw material gas or the like at a prescribed speed can be used as the gas supply pipe 38. Moreover, a power source in a known plasma generation apparatus can be used as the power source for plasma generation 39. The power source for plasma generation 39 supplies electric power to the film-forming rolls 36 and 37 connected thereto to thereby enable the utilization of the film-forming rolls 36 and 37 as counter electrodes for discharge. Since it becomes possible to more effectively implement plasma CVD as the power source for plasma generation 39, the utilization of an alternate current power source or the like capable of alternately reversing the polarity of the film-forming roll. In addition, since it becomes possible to more effectively implement plasma CVD, the use of the power source for plasma generation 39 that can set an applied electric power to be 100

W to 10 kW and an alternate current frequency to be 50 Hz to 500 kHz. Moreover, a known magnetic field-generating device can be used as the magnetic field-generating devices 41 and 42. Furthermore, the base material 11 obtained by previously forming the vapor deposition layer 12 can be used, in addition to the above-described base material 11 that can be applied to the gas barrier film 10, as the film 40. In this way, the thickness of the vapor deposition layer 12 can be made larger by using the base material 11 obtained by previously forming the vapor deposition layer 12, as the film 40.

As described above, the vapor deposition layer 12 can be manufactured through the use of the production apparatus 30 shown in FIG. 5, by adjusting, for example, the kind of raw material gas, the electric power of an electrode drum of the plasma generation apparatus, the pressure in the vacuum chamber, the diameter of the film-forming roll and the conveyance speed of the film. Namely, the film-forming gas (raw material gas etc.) is decomposed by plasma and the vapor deposition layer 12 is formed by a plasma CVD method on the surface of the film 40 on the film-forming roll 36 and on the surface of the film 40 on the film-forming roll 37, through the use of the production apparatus 30 shown in FIG. 5 by performing discharge between the pair of film-forming rolls (film-forming rolls 36 and 37) while supplying film-forming gas (raw material gas or the like) into the vacuum chamber. Note that, in film formation, the vapor deposition layer 12 is formed on the surface of the film 40 by a continuous film formation process of a roll-to-roll system by conveying the film 40 through the use of the feeding roll 31, the film-forming roll 36 and the like, respectively.

(Raw Material Gas)

The raw material gas in the film-forming gas used for forming the vapor deposition layer 12 can be appropriately selected and used, depending on the quality of the material of the vapor deposition layer 12 to be formed. For example, an organic silicon compound containing silicon can be used as the raw material gas. Examples of the organic silicon compounds include hexamethyldisiloxane, 1,1,3,3-tetramethyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, octamethylcyclotetrasiloxane, and the like. Among these organic silicon compounds, hexamethyldisiloxane or 1,1,3,3-tetramethyldisiloxane is used from the viewpoint of handling in the film formation, light distribution properties of the obtained vapor deposition layer 12, and the like. In addition, these organic silicon compounds can be used alone or in combination of two or more kinds thereof.

Furthermore, a reaction gas may be used as the film-forming gas, in addition to the raw material gas. A gas that reacts with the raw material gas to thereby become an inorganic compound such as oxide, nitride or the like can be appropriately selected and used as the reaction gas. For example, oxygen, ozone can be used as the reaction gas for forming an oxide. For example, nitrogen, ammonia can be used as the reaction gas for forming a nitride. These gases can be used alone or in combination of two or more kinds, and for example, in order to form an oxynitride, a reaction gas for forming an oxide can be used in combination of a reaction gas for forming a nitride.

In order to supply the raw material gas into the vacuum chamber, a carrier gas may be used as the film-forming gas as necessary. Furthermore, in order to generate plasma discharge, a gas for discharge may be used as the film-forming gas as necessary. A known gas can be used as the carrier gas and the gas for discharge, and for example, an inert gas such as helium, argon, neon or xenon, or hydrogen can be used.

When the film-forming gas contains the raw material gas and the reaction gas, as to the ratio of the raw material gas and the reaction gas, the ratio of the reaction gas is set to be not too excessive compared with the ratio of the amount of the reaction gas theoretically required for causing the raw material gas to completely react with the reaction gas. When the ratio of the reaction gas is set to be too excessive, light distribution properties of the vapor deposition layer 12 cannot be obtained sufficiently. Furthermore, when the film-forming gas contains an organic silicon compound and oxygen, the amount of the oxygen is not more than the theoretical amount required for completely oxidizing the total amount of the organic silicon compound in the film-forming gas.

Hereinafter, as an example, the case where hexamethyldisiloxane (organic silicon compound: HMDSO: $(CH_3)_6Si_2O$:) is used as a raw material gas and oxygen $(O_2)$ is used as a reaction gas will be explained.

When causing a film-forming gas containing hexamethyldisiloxane as a raw material gas and oxygen as a reaction gas to react by plasma CVD to thereby produce a silicon-oxygen-based thin film, a reaction according to a reaction formula (1) below occurs by the film-forming gas, $$(CH_3)_6Si_2O + 12O_2 \rightarrow 6CO_2 + 9H_2O + 2SiO_2 \tag{1}$$

and silicon dioxide is generated. In the reaction, an oxygen amount necessary for completely oxidizing 1 mol of hexamethyldisiloxane is 12 mol. Consequently, when incorporating not less than 12 mol of oxygen relative to 1 mol of hexamethyldisiloxane in the film-forming gas and causes the gas to completely react, a uniform silicon dioxide film is formed. Therefore, an incomplete reaction is caused to be implemented by controlling the ratio of gas flow amount of the raw material to be a flow amount of not more than the raw material ratio of the complete reaction being the theoretical ratio. Namely, an oxygen amount is required to be less than 12 mol that is a stoichiometric ratio relative to 1 mol of hexamethyldisiloxane.

Note that, in a reaction in an actual plasma CVD chamber, since hexamethyldisiloxane being the raw material and oxygen being the reaction gas are supplied from a gas supply portion to a film formation region, actually the reaction cannot be completely advanced even when the molar amount (flow amount) of the oxygen being the reaction gas is a molar amount (flow amount) of 12 times the molar amount (flow amount) of hexamethyldisiloxane being the raw material. Namely, the reaction is considered to be completed for the first time when oxygen of an extremely excessive content is supplied as compared with the stoichiometric ratio. For example, in order to obtain silicon oxide by complete oxidization through CVD, there is a case where the molar amount (flow amount) of the oxygen is set to be approximately not less than 20 times the molar amount (flow amount) of hexamethyldisiloxane being the raw material.

Therefore, the molar amount (flow amount) of the oxygen relative to the molar amount (flow amount) of hexamethyldisiloxane being the raw material is the amount of 12 times or less being the stoichiometric ratio (or 10 times or less). Carbon atoms or hydrogen atoms of the hexamethyldisiloxane having been not completely oxidized are taken in the vapor deposition layer 12 by incorporating the hexamethyldisiloxane and oxygen at the ratio, and thus the formation of the intended vapor deposition layer 12 becomes possible.

Note that, when the molar amount (flow amount) of oxygen relative to the molar amount (flow amount) of hexamethyldisiloxane in a film-forming gas is too small, the transparency of the vapor deposition layer 12 deteriorates since carbon atoms or hydrogen atoms not having been oxidized are excessively taken in the vapor deposition layer 12. Therefore, hexamethyldisiloxane cannot be utilized for a flexible substrate for which transparency is required, such as the gas barrier film 10. From the viewpoint, the lower limit of the molar amount (flow amount) of the oxygen relative to the molar amount (flow amount) of the hexamethyldisiloxane in the film-forming gas is set to be an amount more than 0.1 times the molar amount (flow amount) of the hexamethyldisiloxane, or to be an amount more than 0.5 times.

(Vacuum Degree)

The pressure (vacuum degree) in the vacuum chamber can appropriately be adjusted in accordance depending on the kind of raw material gas or the like, but is set to be within a range of 0.5 Pa to 100 Pa.

(Film-Forming Roll)

In the above-described plasma CVD method, electric power to be applied to an electrode drum connected to the power source for plasma generation 39 for performing discharge between the film-forming rolls 36 and 37 can appropriately be adjusted depending on the kind of the raw material gas, the pressure in the vacuum chamber or the like. For example, the electric power is set to be within a range of 0.1 to 10 kW. An applied electric power of less than the lower limit tends to generate particles. On the other hand, an electric power exceeding the upper limit generates a large amount of heat in film formation to thereby raise the temperature at the base material surface in the film formation, and the base material 11 suffers heat damage to thereby generate a wrinkle in the film formation.

Note that, in the example, the electrode drum is installed on the film-forming rolls 36 and 37.

The conveyance speed (line speed) of the film 40 can appropriately be adjusted depending on the kind of the raw material gas, the pressure in the vacuum chamber or the like but is set to be within a range of 0.25 to 100 m/min, or to be within a range of 0.5 to 20 m/min. When the line speed is less than the lower limit, a wrinkle caused by heat tends to be more easily generated in the film, whereas, when the line speed exceeds the upper limit, the thickness of the vapor deposition layer 12 to be formed tends to become smaller.

(Smoothing Layer)

A smoothing layer may be formed between the base material 11 and the vapor deposition layer 12. The smoothing layer is provided for flattening a rough surface of the base material 11 on which a projection or the like exist, or for embedding and flattening irregularities or a pinhole generated in the vapor deposition layer 12 by the projection existing on the base material 11. Such a smoothing layer is basically formed by curing a photosensitive resin.

Examples of the photosensitive resins used for forming the smoothing layer include a resin composition containing an acrylate compound having a radically reactive unsaturated compound, a resin composition containing an acrylate compound and a mercapto compound having a thiol group, a resin composition obtained by dissolving a polyfunctional acrylate monomer such as epoxy acrylate, urethane acrylate, polyester acrylate, polyether acrylate, polyethylene glycol acrylate or glycerol methacrylate, and the like. Furthermore, arbitrary mixture of these resin compositions may also be used, and no particular limitation is imposed only as long as the resin composition is a photosensitive resin containing a reactive monomer having one or more photopolymerizable unsaturated bonds in the molecule.

Examples of the reactive monomers having one or more photopolymerizable unsaturated bonds in the molecule include methyl acrylate, ethyl acrylate, n-propyl acrylate, isopropyl acrylate, n-butyl acrylate, isobutyl acrylate, tert-butyl acrylate, n-pentyl acrylate, n-hexyl acrylate, 2-ethyl hexyl acrylate, n-octyl acrylate, n-decyl acrylate, hydroxyethyl acrylate, hydroxypropyl acrylate, allyl acrylate, benzyl acrylate, butoxyethyl acrylate, butoxyethylene glycol acrylate, cyclohexyl acrylate, dicyclopentanyl acrylate, 2-ethyl hexyl acrylate, glycerol acrylate, glycidyl acrylate, 2-hydroxyethyl acrylate, 2-hydroxypropyl acrylate, isobonyl acrylate, isodexyl acrylate, isooctyl acrylate, lauryl acrylate, 2-methoxyethyl acrylate, methoxyethylene glycol acrylate, phenoxy ethyl acrylate, stearyl acrylate, ethylene glycol diacrylate, diethylene glycol diacrylate, 1,4-butanediol diacrylate, 1,5-pentanediol diacrylate, 1,6-hexanediol diacrylate, 1,3-propanediol acrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethyl trimethylolpropane triacrylate, pentaerythritol triacrylate, pentaerythritol tetraacrylate, ethylene oxide-modified pentaerythritol triacrylate, ethylene oxide-modified pentaerythritol tetraacrylate, propyon oxide-modified pentaerythritol triacrylate, propyon oxide-modified pentaerythritol tetraacrylate, triethylene glycol diacrylate, polyoxypropyl trimethylolpropane triacrylate, butylene glycol diacrylate, 1,2,4-butanediol triacrylate, 2,2,4-trimethyl-1,3-pentanediol diacrylate, diallyl fumarate, 1,10-decanediol dimethyl acrylate, pentaerythritol hexaacrylate, those in which the above-describe acrylate is substituted by methacrylate, γ-methacryloxypropyl trimethoxysilane, 1-vinyl-2-pyrrolidone, and the like. The above-described reactive monomers can be used as one kind or as two or more kinds of mixture, or as a mixture with another compound.

The photosensitive resin composition contains a photopolymerization initiator.

Examples of the photopolymerization initiators include benzophenone, methyl o-benzoylbenzoate, 4,4-bis(dimethylamine)benzophenone, 4,4-bis(diethylamine)benzophenone, α-aminoacetophenone, 4,4-dichlorobenzophenone, 4-benzoyl-4-methyldiphenyl ketone, dibenzyl ketone, fluorenone, 2,2-diethoxyacetophenone, 2,2-dimethoxy-2-phenylacetophenone, 2-hydroxy-2-methylpropiophenone, p-tert-butyl-dichloroacetophenone, thioxanthone, 2-methylthioxanthone, 2-chlorothioxanthone, 2-isopropyl-thioxanthone, diethylthioxanthone, benzyldimethyl ketal, benzylmethoxyethyl acetal, benzoin methyl ether, benzoin butyl ether, anthraquinone, 2-tert-butyl-anthraquinone, 2-amyl-anthraquinone, β-chloro-anthraquinone, anthrone, benzanthrone, dibenzsuberon, methyleneanthrone, 4-azidobenzyl acetophenone, 2,6-bis(p-azidobenzylidene)cyclohexane, 2,6-bis(p-azidobenzylidene)-4-methylcyclohexanone, 2-phenyl-1,2-butazone-2-(o-methoxycarbonyl)oxime, 1-phenyl propanedione-2-(o-ethoxycarbonyl)oxime, 1,3-diphenylpropanetrione-2-(o-ethoxycarbonyl)oxime, 1-phenyl-3-ethoxypropanetrione-2-(o-benzoyl)oxime, Michler's ketone, 2-methyl[4-(methylthio)phenyl]-2-monopholino-1-propane, 2-benzyl-2-dimethylamino-1-(4-monopholinophenyl)-butanone-1, naphthalenesulfonyl chloride, quinolinesulfonyl chloride, n-phenylthioacridone, 4,4-azobisisobutyronitrile, diphenyl disulfide, benzothiazole disulfide, triphenyl phosphine, camphorquinone, carbon tetrabromide, tribromophenyl sulfone, benzoin peroxide, a combination of a photoreducable dye such as eosin or methylene blue and a reducing agent such as ascorbic acid or triethanolamine, etc., and these photopolymerization initiators can be used alone or in combination of two or more kinds thereof.

The smoothing layer is, although not particularly limited, formed by a wet coating method such as a spin coating method, a spray method, a blade coating method or a dip method, or by a dry coating method such as a vapor deposition method.

In the formation of the smoothing layer, an additive such as an oxidation inhibitor, an ultraviolet ray absorber or a plasticizer can be added to the above-described photosensitive resin, as necessary. Furthermore, irrespective of the laminated position of the smoothing layer, in any of smoothing layers, a suitable resin or additive may be used for improving the film formation properties, preventing the generation of a pinhole in the film, and the like.

When the smoothing layer is formed using a coating liquid obtained by dissolving or dispersing the photosensitive resin in a solvent, examples of the solvents to be used can include alcohols such as methanol, ethanol, n-propanol, isopropanol, ethylene glycol and propylene glycol, terpenes such as α- and β-terpineol, ketones such as acetone, methyl ethyl ketone, cyclohexanone, N-methyl-2-pyrrolidone, diethylketone, 2-heptanone and 4-heptanone, aromatic hydrocarbons such as toluene, xylene and tetramethylbenzene, glycol ethers such a cellosolve, methyl cellosolve, ethyl cellosolve, carbitol, methyl carbitol, ethyl carbitol, butyl carbitol, propylene glycol monomethyl ether, propylene glycol monoethyl ether, dipropylene glycol monomethyl ether, dipropylene glycol monoethyl ether, triethylene glycol monomethyl ether and triethylene glycol monoethyl ether, acetic esters such as ethyl acetate, butyl acetate, cellosolve acetate, ethyl cellosolve acetate, butyl cellosolve acetate, carbitol acetate, ethyl carbitol acetate, butyl carbitol acetate, propylene glycol monomethyl ether acetate, propylene glycol monoethyl ether acetate, 2-methoxyethyl acetate, cyclohexyl acetate, 2-ethoxyethyl acetate and 3-methoxybutyl acetate, diethylene glycol dialkyl ether, dipropylene glycol dialkyl ether, ethyl 3-ethoxypropionate, methyl benzoate, N,N-dimethylacetamide, N,N-dimethylformamide, and the like.

The smoothness of the smoothing layer is from 10 nm or more to 30 nm or less in the largest cross-section height Rt(p), according to the value expressed by the surface roughness prescribed in JIS B 0601. When the smoothness is smaller than 10 nm, in the step of coating a silicon compound by a coating system such as a wire bar or a wireless bar to be described later, coating properties may be deteriorated when the coating means comes into contact with the smoothing layer surface. In addition, when the smoothness is larger than 30 nm, it may become difficult to smoothen unevenness after coating the silicon compound.

The surface roughness is a roughness related to the amplitude of fine unevenness measured using AFM (an atomic force microscope). The surface roughness is calculated, after performing measurement many times within a zone of several tens μm by a detector having a sensing pin of a minimum tip radius of AFM, from the cross-sectional curve of the unevenness thus continuously measured.

(Additive to Smoothing Layer)

In the smoothing layer, an additive may be contained. As the additive contained in the smoothing layer, a reactive silica particle in which a photosensitive group having photopolymerization reactive properties is introduced on the surface of a photosensitive resin (hereinafter, also simply referred to as a "reactive silica particle").

Here, the photosensitive group having photopolymerization properties can include a polymerizable unsaturated group represented by a (meth)acryloyloxy group, and the like. The photosensitive resin contains a compound capable of a photopolymerization reaction with the photosensitive group introduced on the surface of the reactive silica particle, for example, an unsaturated organic compound having a polymerizable unsaturated group. Furthermore, the photosensitive resin may be mixed with a diluent solvent generally used for the reactive silica particle or the unsaturated organic compound having a polymerizable unsaturated group to thereby be caused to adjust a solid content.

Here, as to an average particle diameter of the reactive silica particle, the average particle diameter of 0.001 to 0.1 μm. By setting the average particle diameter within the range, a smoothing layer having both optical properties such as light distribution properties and hard coat properties is easily formed by using the silica particle in combination with a matting agent made of an inorganic particle having an average particle diameter of 1 to 10 μm to be described later.

Note that the average particle diameter is set within a range of 0.001 to 0.01 μm in order to make the above-described effect more easily obtainable. In the smoothing layer, the inorganic particle as described above is contained in an amount of 20% or more to 60% or less as a mass ratio. The close adhesiveness between the base material 11 and the vapor deposition layer 12 is improved by the addition in an amount 20% or more. Furthermore, when the amount exceeds 60%, the film may be curved, cracks may be generated in performing a thermal treatment, or optical properties of the vapor deposition layer 12 such as the transparency or refractive index may be affected.

Note that, in the example, as the reactive silica particle, polymerizable unsaturated group-modified hydrolyzable silane that generates a silyloxy group and is chemically bonded to the silica particle, by a hydrolysis reaction of a hydrolyzable silyl group can be used.

Examples of the hydrolyzable silyl groups include carboxylate silyl groups such as an alkoxysilyl group and an acetoxysilyl group, halogenated silyl groups such as a chlorosilyl group, an aminosilyl group, an oximesilyl group, a hydridosilyl group, and the like.

Examples of the polymerizable unsaturated groups include an acryloyloxy group, a methacryloyloxy group, a vinyl group, a propenyl group, a butadienyl group, a styryl group, an ethynyl group, a cinnamoyl group, a malate group, an acrylamide group, and the like.

The thickness of the smoothing layer is 1 to 10 μm, or 2 to 7 μm. The smoothness of the base material 11 having the smoothing layer becomes sufficient by setting the thickness to be not less than 1 μm. Additionally, it becomes possible to easily adjust the balance of optical properties, and to easily suppress curling when the smoothing layer is provided only on one surface of the base material 11, by setting the thickness to be 10 μm or less.

Furthermore, the smoothing layer may contain a matting agent as another additive. An inorganic particle having an average particle diameter of approximately 0.1 to 5 μm is as the matting agent.

Silica, alumina, talc, clay, calcium carbonate, magnesium carbonate, barium sulfate, aluminum hydroxide, titanium dioxide, zirconium oxide and the like can be used as the inorganic particle, alone or in combination of two or more kinds thereof.

Here, the matting agent made of an inorganic particle is mixed at a ratio of 2 parts by mass or more, 4 parts by mass or more, 6 parts by mass or more, and 20 parts by mass or less, 18 parts by mass or less, or 16 parts by mass or less, relative to 100 parts by mass of the solid content in the smoothing layer.

(Bleed Out-Preventing Layer)

A bleed out-preventing layer can be provided on the vapor deposition layer 12. The bleed out-preventing layer is provided on the surface of the base material, opposite to the surface having the smoothing layer, in order to suppress a phenomenon in which an unreacted oligomer or the like moves from the inside of the base material 11 to the surface when heating the film-like base material 11 having the smoothing layer to thereby pollute the surface of the base material 11. The bleed out-preventing layer may have the basically same configuration as that of the smoothing layer as long as the layer has the function.

An unsaturated organic compound having a polymerizable unsaturated group can be used as the bleed out-preventing layer. A polyvalent unsaturated organic compound having two or more polymerizable unsaturated groups in the molecule, a monovalent unsaturated organic compound having one polymerizable unsaturated group in the molecule, or the like is used as the unsaturated organic compound.

Here, examples of the polyvalent unsaturated organic compounds include ethylene glycol di(meth)acrylate, diethylene glycol di(meth)acrylate, glycerol di(meth)acrylate, glycerol tri(meth)acrylate, 1,4-butanediol di(meth)acrylate, 1,6-hexanediol di(meth)acrylate, neopentyl glycol di(meth) acrylate, trimethylolpropane tri(meth)acrylate, dicyclopentanyl di(meth)acrylate, pentaerythritol tri(meth)acrylate, pentaerythritol tetra(meth)acrylate, dipentaerythritol hexa (meth)acrylate, dipentaerythritol monohydroxy penta(meth) acrylate, ditrimethylolpropane tetra(meth)acrylate, diethylene glycol di(meth)acrylate, polyethylene glycol di(meth) acrylate, tripropylene glycol di(meth)acrylate, polypropylene glycol di(meth)acrylate, and the like.

Furthermore, examples of the monovalent unsaturated organic compounds include methyl (meth)acrylate, ethyl (meth)acrylate, propyl (meth)acrylate, butyl (meth)acrylate, 2-ethyl hexyl (meth)acrylate, isodecyl (meth)acrylate, lauryl (meth)acrylate, stearyl (meth)acrylate, allyl (meth)acrylate, cyclohexyl (meth)acrylate, methylcyclohexyl (meth)acrylate, isobornyl (meth)acrylate, 2-hydroxyethyl (meth)acrylate, 2-hydroxypropyl (meth)acrylate, glycerol (meth)acrylate, glycidyl (meth)acrylate, benzyl (meth)acrylate, 2-ethoxyethyl (meth)acrylate, 2-(2-ethoxyethoxy)ethyl (meth)acrylate, butoxyethyl (meth)acrylate, 2-methoxyethyl (meth)acrylate, methoxy diethylene glycol (meth)acrylate, methoxy triethylene glycol (meth)acrylate, methoxy polyethylene glycol (meth)acrylate, 2-methoxypropyl (meth) acrylate, methoxy dipropylene glycol (meth)acrylate, methoxy tripropylene glycol (meth)acrylate, methoxy polypropylene glycol (meth)acrylate, polyethylene glycol (meth) acrylate, polypropylene glycol (meth)acrylate, and the like.

Moreover, in the bleed out-preventing layer, a thermoplastic resin, a thermosetting resin, an ionizing radiation-curable resin, a photopolymerization initiator and the like may be incorporated.

Examples of the thermoplastic resins include cellulose derivatives such as acetyl cellulose, nitro cellulose, acetyl butyl cellulose, ethyl cellulose and methyl cellulose, vinyl-based resins such as vinyl acetate and copolymers thereof, vinyl chloride and copolymers thereof, and vinylidene chloride and copolymers thereof, acetal-based resins such as polyvinyl formal and polyvinyl butyral, acrylic resin such as acrylic resin and copolymers thereof and methacrylic resin and copolymers thereof, polystyrene resin, polyamide resin, linear polyester resin, polycarbonate resin, and the like.

Additionally, examples of the thermosetting resins include thermosetting urethane resin made of acrylic polyol and isocyanate prepolymer, phenol resin, urea-melamine resin, epoxy resin, unsaturated polyester resin, silicon resin, and the like.

In addition, the ionizing radiation-curable resin can be cured by irradiating an ionizing radiation-curable paint obtained by mixing one kind of, or two or more kinds of photopolymerizable prepolymers, photopolymerizable monomers or the like with ionizing radiation (ultraviolet rays or electron beams). Here, an acrylic prepolymer having two or more acryloyl groups in one molecule and forms a three dimensional net structure by cross-linking curing is the photopolymerizable prepolymer. Urethane acrylate, polyester acrylate, epoxy acrylate, melamine acrylate and the like can be used as the acrylic prepolymer. Additionally, the above-described polyvalent unsaturated organic compound or the like can be used as the photopolymerizable monomer.

Furthermore, examples of the photopolymerization initiators include acetophenone, benzophenone, Michler's ketone, benzoin, benzyl methylketal, benzoin benzoate, hydroxycyclohexyl phenyl ketone, 2-methyl-1-(4-(methylthio)phenyl)-2-(4-morpholinyl)-1-propane, α-acyloxime ester, thioxanthones, and the like.

The bleed out-preventing layer can be formed by compounding the matting agent and anther necessary component, and then preparing a coating liquid with a diluent solvent as necessary, coating the coating liquid onto the base material surface by a conventionally known coating method, and irradiating the coating liquid with the ionizing radiation to thereby cure the same. Note that irradiation with ultraviolet rays in a wavelength region of 100 to 400 nm, or 200 to 400 nm emitted from an ultrahigh-pressure mercury lamp, a high-pressure mercury lamp, a low-pressure mercury lamp, a carbon arc, a metal halide lamp or the like are performed as the ionizing radiation. Alternatively, irradiation with electron beams in a wavelength region of 100 nm or less emitted from a scanning-type or a curtain-type electron beam accelerator is performed.

The thickness of the bleed out-preventing layer is from 1 to 10 μm, or from 2 to 7 μm. By setting it to be not less than 1 μm, sufficient heat resistance can be secured. Additionally, it becomes possible to easily adjust the balance of optical properties, and to easily suppress curling when the smoothing layer is provided only on one surface of the base material 11, by setting the thickness to be 10 μm or less.

[Polysilazane Modified Layer]

The polysilazane modified layer 13 is a layer provided for making the unevenness of the surface of the vapor deposition layer 12, and a translucent layer formed on the vapor deposition layer 12. The polysilazane modified layer 13 is a layer formed by subjecting the coating layer of the polysilazane-containing liquid to modification treatment. The modified layer is mainly formed of a silicon oxide or a silicon oxynitride compound.

A method for forming the polysilazane modified layer 13 include a method for forming a layer containing a silicon oxide or a silicon oxynitride compound, by performing a modification treatment after coating at least one coating liquid containing a polysilazane compound on a base material.

As to the supply of a silicon oxide or a silicon oxynitride compound for forming the polysilazane modified layer 13 of a silicon oxide or a silicon oxynitride compound, the coating on the surface of the base material rather than the supply as gas like in a CVD (Chemical Vapor Deposition) method makes it possible to form a more uniform and smooth layer. In the case of a CVD method and the like, it is known that unnecessary foreign substances referred to as a particle are generated in the gas phase, at the same time as the process of the vapor deposition of a raw material having an increased reactivity in the gas phase on the surface of the base material. As the result of the accumulation of these generated particles, the smoothness of the surface deteriorates. In the coating method, the suppression of the generation of these particles becomes possible by not allowing raw materials to exist in a gas-phase reaction space. Consequently, a smooth surface can be formed through the use of the coating method.

(Coated Film of Polysilazane-Containing Liquid)

The coated film of a polysilazane-containing liquid is formed by coating a coating liquid containing a polysilazane compound at least in one layer on the base material.

Any appropriate method may be employed as a coating method. Specific examples include a spin coat method, a roll coat method, a flow coat method, an ink jet method, a spray coat method, a print method, a dip coat method, a casting film formation method, a bar coat method, a gravure printing method etc. The thickness of the application may be set appropriately corresponding to an object. For example, the coating thickness may be set so that the thickness after drying is approximately 1 nm to 100 μm, approximately 10 nm to 10 μm, or approximately 10 nm to 1 μm.

"Polysilazane" is a polymer having a silicon-nitrogen bond, and is a ceramic precursor inorganic polymer such as $SiO_2$, $Si_3N_4$ and an intermediate solid solution $SiO_xN_y$ of both the substances, made of Si—N, Si—H, N—H and the like. The polysilazane is represented by a general formula (I) below.

[Chem. 1]

General formula (I)

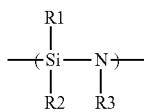

In order to perform the coating so as not to damage the film base material, one that is made into a ceramic at comparatively low temperatures and degenerates into silica as described in Japanese Patent Application Laid-open Publication No. 08-112879.

In the formula, R1, R2 and R3 each represent independently a hydrogen atom, an alkyl group, an alkenyl group, a cycloalkyl group, an aryl group, an alkylsilyl group, an alkylamimo group, an alkoxy group or the like.

From the viewpoint of denseness of a barrier film to be obtained, perhydropolysilazane in which all of R1, R2 and R3 are hydrogen atoms.

On the other hand, organopolysilazane in which a part of the hydrogen portion to be bonded to Si thereof is substituted by an alkyl group or the like has the advantage that the generation of crack is suppressed even when (an average) film thickness is made larger, because adhesiveness to the base material of the base is improved by having an alkyl group such as a methyl group and toughness can be given to a ceramic film based on hard and brittle polysilazane. The perhydropolysilazane or organopolysilazane may be selected, or these can be used in mixture, depending on use applications.

The perhydropolysilazane is presumed to have a structure in which a linear structure and a ring structure with 6- and 8-membered ring as the center exist. The molecular weight thereof is approximately 600 to 2000 (in terms of polystyrene) in number average molecular weight (Mn), and the perhydropolysilazane is a liquid or solid material and differs depending on the molecular weight. These are available in the market in a solution state dissolved in an organic solvent, and a commercially available product can be used as is, as a polysilazane-containing coating liquid.

Other examples of polysilazane changing into ceramic at low temperatures include siliconalkoxide-added polysilazane obtained by causing polysilazane represented by the general formula (I) to react with siliconalkoxide (Japanese Patent Application Laid-Open Publication No. 05-238827), glycidol-added polysilazane obtained by causing the polysilazane to react with glycidol (for example, Japanese Patent Application Laid-Open Publication No. 06-122852), alcohol-added polysilazane obtained by causing the polysilazane to react with alcohol (Japanese Patent Application Laid-Open Publication No. 06-240208), metal carboxylate-added polysilazane obtained by causing the polysilazane to react with metal carboxylate (Japanese Patent Application Laid-Open Publication No. 06-299118), acetylacetonate complex-added polysilazane obtained by causing the polysilazane to react with acetylacetonate complex containing a metal (Japanese Patent Application Laid-Open Publication No. 06-306329), metal-fine-particle-added polysilazane obtained by adding metal fine particles (Japanese Patent Application Laid-Open Publication No. 07-196986) and the like.

Organic solvents that can be used for preparing a liquid containing polysilazane include, specifically, hydrocarbon solvents such as aliphatic hydrocarbon, alicyclic hydrocarbon and aromatic hydrocarbon, halogenated hydrocarbon solvents, and ethers such as aliphatic ether and alicyclic ether. Specifically, there are hydrocarbons such as pentane, hexane, cyclohexane, toluene, xylene, Solvesso and terpene, halogenated hydrocarbons such as methylene chloride and trichloroethane, ethers such as dibutyl ether, dioxane and tetrahydrofuran. These solvents are selected in accordance with an object such as the solubility of polysilazane, vapor deposition rate or the like, and a plurality of solvents may be mixed. Note that an alcohol-based and water-containing solvent are not used because of reacting easily with polysilazane.

The concentration of polysilazane in the polysilazane-containing coating liquid is approximately 0.2 to 35% by mass, although the concentration differs depending on an intended silica film thickness or a pot life of the coating liquid.

The organic polysilazane may be a derivative in which a part of the hydrogen portions that is bonded to Si thereof are substituted by an alkyl group or the like. The adhesiveness to an underlying base material is improved by having an alkyl group, particularly, a methyl group with the smallest molecular weight, toughness can be imparted to a hard and brittle silica film, and the generation of a crack is suppressed even when the film thickness is made larger.

A catalyst of amine or metal can also be added in order to accelerate the conversion to a silicon oxide compound. Specifically, AQUAMICA NAX120-20, NN110, NN310, NN320, NL110A, NL120A, NL150A, NP110, NP140, SP140 and the like, all of which are manufactured by AZ ELECTRONIC MATERIALS, are included.

(Process for Forming Polysilazane Modified Layer)

Moisture is to be removed from the coating film of a polysilazane-containing liquid before the modification treatment or during the treatment. Therefore, the process is separated into a first process for the purpose of removing the solvent in the polysilazane-coating film and a subsequent second process for the purpose of removing the moisture in the polysilazane-coating film.

In the first process, drying conditions for mainly removing the solvent can appropriately be determined by a method of a thermal treatment, and the conditions of removing the moisture at this time are also acceptable. A thermal treatment temperature is high from the viewpoint of a rapid treatment, but temperature and treatment time are determined in consideration of a thermal damage to a resin base material. For example, when a PET base material having the glass transition temperature (Tg) of 70° C. is used as the resin base material, the thermal treatment temperature can be set to be 200° C. or less. The treatment time is set so that the solvent is to be removed, and in a short time so as to reduce a thermal damage to the base material, and when the thermal treatment temperature is 200° C. or less, the treatment time can be set within 30 minutes.

The second process is a process for removing the moister in the polysilazane-coating film, and an aspect of being maintained in a low humidity environment is as a method for removing the moisture. The humidity in the low humidity environment changes depending on temperatures and thus, regarding the relationship between the temperature and humidity, a form is shown based on the specification of the dew-point temperature. A dew-point temperature is 4 degrees or less (temperature 25 degree/humidity 25%), a dew-point temperature is −8 degrees or less (temperature 25 degree/humidity 10%), or a dew-point temperature is −31 degrees or less (temperature 25 degree/humidity 1%), and the time to be maintained changes appropriately depending on the thickness of the polysilazane modified layer 13. Under conditions in which the thickness of the polysilazane modified layer is 1 μm or less, a dew-point temperature is −8 degrees or less and the time to be maintained is 5 minutes or more. In addition, reduced-pressure drying may be performed so that the moisture is easily removed. The pressure in the reduced-pressure drying can be selected from a normal pressure to 0.1 MPa.

As to conditions in the second process relative to the conditions in the first process, for example, when the solvent is removed at a temperature of 60 to 150° C. for a treatment time of 1 minute to 30 minutes in the first process, conditions for removing the moisture in which a dew point of 4 degrees or less and a treatment time of 5 minutes to 120 minutes can be selected in the second process. The classification of the first process and the second process can be distinguished based on the change in the dew point, and the classification can be carried out by the change in the difference of dew points of process environments by 10 degrees or more.

The polysilazane modified layer 13 is subjected to a modification treatment, even after the removal of the moisture in the second process, while maintaining the state.

(Moisture Content of Polysilazane Modified Layer)

The moisture quantity contained in the polysilazane modified layer 13 can be detected in accordance with a following analytical method.

Headspace gas chromatography/mass spectrometry
Apparatus: HP6890GC/HP5973MSD

Oven: 40° C. (2 min), after that, temperature is raised to 150° C. at a rate of 10° C./min
Column: DB-624 (0.25 mmid×30 m)
Injection port: 230° C.
Detector: SIM m/z=18
HS condition: 190° C., 30 min The moisture content in the polysilazane modified layer is defined as a value obtained by dividing the moisture quantity obtained by the above-described analytical method, by the volume of the polysilazane modified layer 13, and the content is 0.1% or less in a state where the moisture has been removed in the second process. Further moisture content is 0.01% or less (detection limit or less).

The removal of the moisture before the modification treatment or during the modification is an aspect because a dehydration reaction of the polysilazane having converted to a silanol is accelerated.

(Modification Treatment)

A known method based on the conversion reaction of polysilazane can be selected as the modification treatment. High temperatures of 450° C. or more is required for the production of a silicon oxide film or a silicon oxynitride film by a substitution reaction of a silazane compound, and adaptation is difficult in the case of flexible substrates such as plastic. Conversion reactions using plasma, ozone or ultraviolet rays capable of a conversion reaction at lower temperatures are the adaptation for a plastic substrate.

Specifically, the same method as that used for the above surface treatment of the vapor deposition layer 12 can be applied. In order to apply to the plastic substrate, a conversion reaction by using plasma, ozone or ultraviolet ray which can convert under a lower temperature. Particularly a modification treatment by vacuum ultraviolet ray irradiation with a rear gas excimer lamp.

(Smoothness: Surface Roughness Ra)

A surface roughness (Ra) of the surface of the polysilazane modified layer 13 is 2 nm or less, or 1 nm or less. As the result of the surface roughness being within the range, in using the polysilazane modified layer as a resin base material for the organic EL element, a light transmission efficiency is enhanced by a smooth film surface having a little unevenness and an energy conversion efficiency is enhanced by the reduction of a leak current between electrodes. The surface roughness (Ra) of the polysilazane modified layer 13 can be measured by the following method.

The surface roughness (Ra) of the polysilazane modified layer 13 can be made 2 nm or less after coating a coating liquid constituting the polysilazane modified film and then drying under a condition in which the solvent and moisture are removed uniformly, in the case of, for example, forming the polysilazane coating film by coating. Alternatively, the surface roughness (Ra) of the polysilazane modified layer 13 can be made 2 nm or less, by optimizing a concentration and viscosity of the coating liquid and a rate of coating speed, selecting a leveling agent, or the like.

(Method for Measuring Surface Roughness; AFM Measurement)

The surface roughness is calculated from a cross-sectional curve of unevenness continuously measured using a detector having a sensing pin with a minimum tip radius by AFM (atomic force microscope), for example, using DI3100 manufactured by Digital Instruments, is measured many times within a zone of several tens μm in the measurement direction with a sensing pin having a minimum tip radius, and is a roughness related to the amplitude of fine unevenness.

[Effect of Gas Barrier Film]

In the above-described gas barrier film 10, the surface of the vapor deposition layer 12 is converted to being hydrophilic as a result of the surface modification treatment. Therefore, in the process of forming the polysilazane on the vapor deposition layer 12, coating ability of the polysilazane-containing liquid is enhanced and the adhesion property between the polysilazane modified layer 13 and the vapor deposition layer 12 is enhanced. Furthermore, due to the hydrophilic group formed on the surface of the vapor deposition layer 12 by the surface modification treatment, the adhesion property to the polysilazane modified layer 13 is enhanced.

In addition, since the vapor deposition layer 12 is constituted by the silicon compound having the change in composition in the inclined manner, the modification treatment is easily proceeded from the surface to the direction of depth in carrying out the modification treatment. Therefore, the surface treatment of the vapor deposition layer 12 can be carried out sufficiently and uniformly to thereby form a sufficient amount of a hydrophilic group on the surface of the vapor deposition layer 12.

<2. Production Method of Gas Barrier Film>

Next, the production method of the gas barrier film 10 will be explained. The gas barrier film 10 can be produced by using the method of forming each configuration as explained in the above-described embodiments of the gas barrier film 10.

First, the base material 11 is prepared. The base material 11 can be arbitrarily selected from the above-described resin films.

Next, the vapor deposition layer 12 is formed on the base material 11. The vapor deposition layer 12 is formed by using a raw material gas containing the silicon compound together with at least one element selected from carbon (C), nitrogen (N) and oxygen (O) by the vapor deposition method. Specifically, the vapor deposition layer 12 is formed by using a plasma CVD roll coater device shown in the above FIG. 5 by a roll-to-roll system.

At this time, the silicon compound having the change in composition in an inclined manner is accumulated by controlling a supply amount of the raw material gas containing at least one element selected from carbon (C), nitrogen (N) and oxygen (O).

Next, the modification treatment of the silicon compound is carried out by surface-treating the vapor deposition layer 12 thus formed. The surface treatment can be conducted by using plasma, ozone, and an ultraviolet ray. Particularly, a vacuum ultraviolet ray irradiation treatment by using a rare gas excimer lamp. As a result of the surface treatment, the surface of the vapor deposition layer 12 including the silicon compound is made hydrophilic. Furthermore, to carry out the modification treatment of the silicon compound to a depth of 15 nm or more, 30 nm or more from the surface by appropriately adjusting the treatment period of time, and the like.

Subsequently, the polysilazane modified layer 13 is formed on the thus surface treated vapor deposition layer 12.

The formation of the polysilazane modified layer 13 is carried out, as described above, by the process of coating the polysilazane-containing liquid, the process of removing the solvent and water in the coating film, and the process of subjecting the polysilazane coating film to the modification treatment.

For example, the polysilazane-containing liquid is coated on the vapor deposition layer 12 after preparing the polysilazane-containing liquid by using a polysilazane such as paerhydropolysilazane. At this time, since the vapor deposition layer 12 has been surface-treated, the wettability of the polysilazane-containing liquid becomes satisfactory.

Furthermore, the polysilazane-containing coating film is subject to the modification treatment after removing the solvent and moisture by the drying treatment or under a low moisture atmosphere. The modification treatment may be carried out by using the same as the above-described surface treatment of the vapor deposition layer 12, or may be carried out by using different methods. The method is a vacuum ultraviolet ray irradiation treatment by using a rare gas excimer lamp.

According to the above-described processes, there can be produced, on the base material 11, the gas barrier film 10 including: the vapor deposition layer 12 which is of a surface-treated silicon compound, which contains at least one element selected from carbon (C), nitrogen (N), and oxygen (O), and which has the continuous change in composition in the direction of thickness from the surface; and the ploysilazane modified layer 13 formed on the vapor deposition layer 12.

<3. Organic Electroluminescent Element>

[Configuration of Organic Electroluminescent Element]

Embodiments including the organic electroluminescent element (hereinafter referred to as organic EL element) will be explained.

Figure 6:
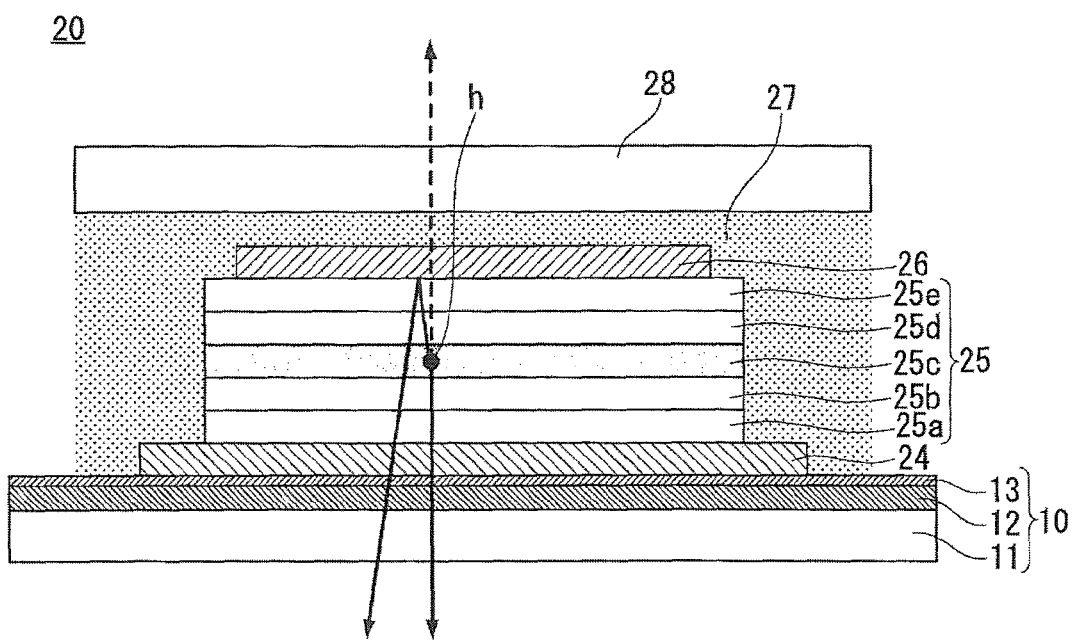
FIG. 6 is a view illustrating a schematic configuration of an organic electroluminescent element of a third embodiment.

FIG. 6 shows a schematic view (cross-sectional view) of the organic EL element according one or more embodiments of the invention. As shown in FIG. 6, the organic EL element 20 is provided with the base material 11, the vapor deposition layer 12, the polysilazane modified layer 13, a first electrode 24, an organic functional layer 25, a second electrode 26, a sealing resin layer 27, and a sealing member 28.

In the organic EL element 20 shown in FIG. 6, the base material 11, the vapor deposition layer 12 and the polysilazane modified layer 13 are the same configurations as those of the gas barrier film 10.

The organic EL element 20 shown in FIG. 6 has the configuration in which the first electrode 24 serving as an anode, the organic functional layer 25 provided with a light-emitting layer, and the second electrode 26 serving as a cathode are laminated on the gas barrier film 10. Furthermore, the first electrode 24, the organic functional layer 25 and the second electrode 26 are sealed in a solid manner by the gas barrier film 10, the sealing resin layer 27 and the sealing member 28.

In addition, in the organic EL element 20, the first electrode 24 used as an anode is constituted as a translucent electrode. In this configuration, only the portion where the organic functional layer 25 is sandwiched between the first electrode 24 and the second electrode 26 serves as a light-emitting area in the organic EL element 20. In addition, the organic EL element 20 is constituted as a bottom-emission type in which a emitted light (hereinafter, referred to as emitted light h) is taken out from at least the base material 11 side.

Furthermore, the organic EL element 20 is solid-sealed, on one surface of the base material 11, by pasting the sealing member 28, via the sealing resin layer 27 which covers the first electrode 24, the organic functional layer 25, and the second electrode 26. In the solid sealing of the organic EL element 20, an uncured resin material is coated at a plurality of points on at least the surface to be pasted of the sealing member 28, or on the polysilazane modified layer 13 and the second electrode 26 of the base material 11, and then the base material 11 and the sealing member 28 are compressed under heating while the resin material is sandwiched, and integrated.

Hereinafter, as to the instant organic EL element 20, the gas barrier film 10, the first electrode 24 and the second electrode 26, the organic functional layer 25, the sealing resin layer 27, the sealing member 28 will be explained in detail in this order. In the organic EL element 20 of the Example, the light transmission property means that a light transmittance at a wavelength of 550 nm is 50% or more.

[Gas Barrier Film]

In the organic EL element 20, the gas barrier film 10 can be applied in the same configuration as described above.

A flexible base material, particularly a transparent resin film is used as the base material 11 constituting the gas barrier film 10.

The vapor deposition layer 12 is the silicon compound which contains at least one element selected from carbon (C), nitrogen (N) and oxygen (O) and which is formed by the vapor deposition method. The silicon compound constituting the vapor deposition layer 12 has characteristics in which the composition is changed in an inclined manner in the depth direction (in the direction of thickness) from the surface. Furthermore, the surface of the vapor deposition layer 12 is subjected to modification treatment in order to enhance the adhesion property to the polysilazane modified layer 13.

The polysilazane modified layer 13 is a layer which contains a silicon oxide or a silicon oxide nitride compound formed by coating a coating liquid containing a polysilazane compound component, and then by performing the modification treatment.

[First Electrode (Anode Side), Second Electrode (Cathode Side)]

(First Electrode)

In the organic EL element 20, the first electrode 24 substantially serves as an anode. The organic EL element 20 is an element of bottom emission type in which the light is taken out from the base material 11 side through the first electrode 24. Therefore, the first electrode 24 is required to be formed by a translucent electric conductive layer.

The first electrode 24 is, for example, a layer constituted by containing silver as a main component, and a layer constituted by using silver or an alloy containing silver as a main component. The formation method of the first electrode 24 includes: a method of using a wet process such as an applying method, an inkjet method, a coating method or a dipping method; a method of using a dry process such as a vapor deposition method (resist heating, EB method, or the like), a sputtering method or a CVD method; and the like. Among them, the vapor deposition method is applied.

Examples of the alloy containing silver (Ag) as a main component constituting the first electrode 24 include silver magnesium (AgMg), silver copper (AgCu), silver palladium (AgPd), silver palladium copper (AgPdCu), silver indium (AgIn), and the like.

The above-described first electrode 24 may be a laminated structure where a plural of the layer of silver or the alloy of silver as a main component is laminated, as necessary, in a separated manner.

Furthermore, the first electrode 24 has a thickness of the range of 4 to 12 nm. When the thickness is 12 nm or less, it is because an absorption component and a reflection component in the layer may be decreased to maintain the light transmittance of the translucent electrode. In addition, when the thickness is 4 nm or more, the electric conductivity is ensured.

Note that, as to the above first electrode 24, the upper portion may be covered with a protective film, or may be laminated with other electrically conductive layer. In this case, the protective film and the electrically conductive layer have light transmittance so as not to impair its light transmittance of the organic EL element 20.

In addition, the configuration may be such that necessary a layer as needed is provided at the lower portion of the first electrode 24, namely, also between the polysilazane modified layer 13 and the first electrode 24. For example, an underlayer for enhancing the performances of the first electrode 24 or for facilitating the formation may be formed.

Furthermore, the first electrode 24 may have a configuration other than the above configuration of containing silver as a main component. For example, any transparent electrically conductive substance thin film such as other metal or an alloy thereof, ITO, zinc oxide, or tin oxide may be used.

(Second Electrode)

The second electrode 26 is an electrode layer which functions as a cathode for supplying an electron to the organic functional layer 25, and is composed of a metal, an alloy, an electrically conductive organic or inorganic compound, and a mixture thereof. Specific examples include gold, aluminum, silver, magnesium, lithium, magnesium/copper mixture, magnesium/silver mixture, magnesium/aluminum mixture, magnesium/indium mixture, indium, lithium/aluminum mixture, a rare earth metal, ITO, ZnO, $TiO_2$, $SnO_2$, and the like.

The second electrode 26 can be formed from an electrically conductive material by the vapor deposition method or the sputtering method, and the like. In addition, the sheet resistance of the second electrode 26 is hundreds $\Omega$/sq. or less, and a thickness is usually selected from the range of 5 nm to 5 μm, or 5 nm to 200 nm.

Note that, when the organic EL element 20 is a both side emitting type in which light is also taken out the emitted light h from the second electrode 26 side, the second electrode 26 is constituted by selecting an electrically conductive material having a good light transmittance from the above-described electrically conductive materials.

[Organic Functional Layer]

The organic functional layer 25 can exemplify a configuration in which [positive hole injection layer 25a/positive hole transport layer 25b/light-emitting layer 25c/electron transport layer 25d/electron injection layer 25e] are laminated in this order in the upper portion of the first electrode 24 as an anode, and is required to have at least the light-emitting layer 25c constituted by using an organic material. The positive hole injection layer 25a and the positive hole transport layer 25b may be provided as a positive hole transport/injection layer which has the positive hole transporting property and the positive hole injecting property. The electron transport layer 25d and the electron injection layer 25e may be provided as a single layer having the electron transporting property and the electron injecting property. Moreover, in the organic functional layer 25, for example, the electron injection layer 25 e may be constituted of an inorganic material.

In addition, in the organic functional layer 25, a positive hole block layer and an electron block layer also other than these layers may be provided as necessary. Furthermore, the light-emitting layer 25c has various light-emitting layers which generate various emitted lights having various wavelengths, and may be formed as a light-emitting layer unit by laminating the various light-emitting layers via non-emitting intermediate layers. The intermediate layer may function as the positive hole block layer and the electron block layer.

[Light-Emitting Layer]

The light-emitting layer 25c contains, for example, a phosphorescence-emitting compound as a light-emitting material.

The light-emitting layer 25c is a layer which emits light through recombination of electrons injected from an electrode or an electron transport layer 25d and positive holes injected from the positive hole transport layer 25b. A portion that emits light may be either the inside of the light-emitting layer 25c or an interface between the light-emitting layer 25c and its adjacent layer.

The configuration of the light-emitting layer 25c is not particularly limited as long as the light-emitting material contained therein satisfies a light emission requirement. In addition, there may be a plurality of light-emitting layers having the same emission spectrum and/or emission maximum wavelength. In the case, it is that non-luminescent intermediate layers (not shown) are present between the respective light-emitting layers 25c.

The total thickness of the light-emitting layers 25c is within a range of 1 to 100 nm and, or within a range of 1 to 30 nm from the viewpoint of obtaining a lower driving voltage. Note that the total thickness of the light-emitting layers 25c is a thickness including the thickness of the intermediate layers when the non-luminescent intermediate layers are present between the light-emitting layers 25c.

In the case of the light-emitting layer 25c constituted by lamination of a plurality of layers, it is to adjust the thickness of individual light-emitting layer to be within a range of 1 to 50 nm and it is to adjust the thickness thereof to be within a range of 1 to 20 nm. When the plurality of the laminated light-emitting layers corresponds to the emitted color of blue, green and red, respectively, the relationship between the respective thicknesses of the light-emitting layers of blue, green and red is not particularly limited.

The above light-emitting layer 25c can be formed by a well-known thin film forming method such as a vacuum vapor deposition method, a spin coating method, a casting method, an LB method or an ink-jet method of a light-emitting material and a host compound, which are described below.

In addition, in the light-emitting layer 25c, a plurality of light-emitting materials may be mixed. Furthermore, a fluorescence-emitting material and a fluorescence-emitting material (also referred to as fluorescence-emitting dopant, fluorescence-emitting compound) may be mixed in the same light-emitting layer 25c.

The light-emitting layer 25c is constituted so as to contain a host compound (also referred to as emitting host) and a light-emitting material (also referred to as light-emitting dopant compound, a guest compound), and emit light through the light-emitting material.

(Host Compound)

The host compound contained in the light-emitting layer 25c is a compound having a phosphorescence quantum yield in phosphorescence emission of less than 0.1 at room temperature (25° C.). In addition, the host compound has a phosphorescent quantum yield of less than 0.01. Furthermore, among the compounds contained in the light-emitting layer 25c, a volume ratio in the layer of 50% or more.

A well-known host compound may be used as the host compound, alone or in combination of a plurality of kinds. The use of a plurality of host compounds makes it possible to adjust transfer of charges, and to increase an efficiency of the organic EL element 20. Furthermore, the use of a plurality of light-emitting materials described below makes it possible to mix different colors of light to be emitted, and to thereby produce any luminous color.

The host compound to be used may be a well-known low molecular weight compound, a high molecular compound having a repeating unit or a low-molecular-weight compound having a polymerizable group such as a vinyl group or an epoxy group (evaporation-polymerizable light emission host) may be used.

The well-known host compound is a compound preventing a light emission wavelength from becoming longer and having a high Tg (glass transition temperature), while having a positive hole transport ability and an electron transport ability. The glass transition temperature Tg herein is a value measured using DSC (Differential Scanning Colorimetry) in accordance with JIS-K-7121.

Examples of the host compound which is applicable to the organic electroluminescent element include the compound H1 to H79 described in Paragraphs [0163] to [0178] of Japanese Patent Application Laid-Open Publication No. 2013-4245. The compounds H1 to H79 described in Paragraphs [0163] to [0178] of Japanese Patent Application Laid-Open Publication No. 2013-4245 are incorporated into the present description.

Furthermore, specific examples of other well-known host compounds include compounds described in the following documents; for example, Japanese Patent Application Laid-Open Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

(Light-Emitting Material)

The light-emitting material that can be used in the organic electroluminescent element in accordance with one or more embodiments of the invention includes a phosphorescence-emitting compound (also referred to as a phosphorescent compound or a phosphorescence-emitting material).

The phosphorescence-emitting compound is defined as a compound in which light emission from an excited triplet state is observed, and, specifically, a compound which emits phosphorescence at room temperature (25° C.) and a phosphorescence quantum yield at 25° C. is 0.01 or more, and phosphorescence quantum yield is 0.1 or more.

The above-described phosphorescence quantum yield can be measured by a method described on page 398 of Bunko II of Dai 4 Han Jikken Kagaku Koza 7 (Spectroscopy II of Lecture of Experimental Chemistry vol. 7, 4th edition) (1992, published by Maruzen Co., Ltd.). The phosphorescence quantum yield in a solution can be measured by using various solvents, and when the phosphorescence-emitting compound used in the example, it is sufficient that the above-described phosphorescence quantum yield (0.01 or more) is achieved in any of arbitrary solvents.

There are two kinds of principles regarding light emission of the phosphorescence-emitting compound. One is an energy transfer type, wherein carriers recombine on a host compound which transfers the carriers so as to produce an excited state of the host compound, this energy is transferred to a phosphorescence-emitting compound, and then light emission from the phosphorescence-emitting compound is carried out. The other is a carrier trap-type, in which a phosphorescence-emitting compound serves as a carrier trap, carriers recombine on the phosphorescence-emitting compound, and then light emission from the phosphorescence-emitting compound is carried out. In either case, the excited state energy of the phosphorescence-emitting compound is required to be lower than that of the host compound.

The phosphorescence-emitting compound can be suitably selected and used from the well-known phosphorescence-emitting compounds used for light-emitting layers of general organic electroluminescent elements, a complex-based compound containing metal of the groups 8 to 10 in the element periodic table, and an iridium compound, an osmium compound, a platinum compound (a platinum complex-based compound) or a rare earth complex, or an iridium compound.

In the organic electroluminescent element, at least one light-emitting layer 25c may contain two or more kinds of light-emitting compounds, and a ratio of concentration of the phosphorescence-emitting compound in the light-emitting layer 25c may vary in the direction of thickness of the light-emitting layer 25c.

An amount of the phosphorescence-emitting compound is 0.1% by volume or more and less than 30% by volume to the total volume of the light-emitting layer 25c.

Examples of the phosphorescence emitting compound which is applicable to the organic electroluminescent element include the compounds represented by the general formula (4), the general formula (5), the general formula (6) and the exemplified compounds described in Paragraphs [0185] to [0235] of Japanese Patent Application Laid-Open Publication No. 2013-4245. As the other exemplified compounds, the following Ir-46, Ir-47, Ir-48 are shown. The compounds represented by the general formula (4), the general formula (5), the general formula (6) and the exemplified compounds (Pt-1 to Pt-3, Os-1, Ir-1 to Ir-45) described in Paragraphs [0185] to [0235] of Japanese Patent Application Laid-Open Publication No. 2013-4245 are incorporated into the present description.

[Chemical formula 2]

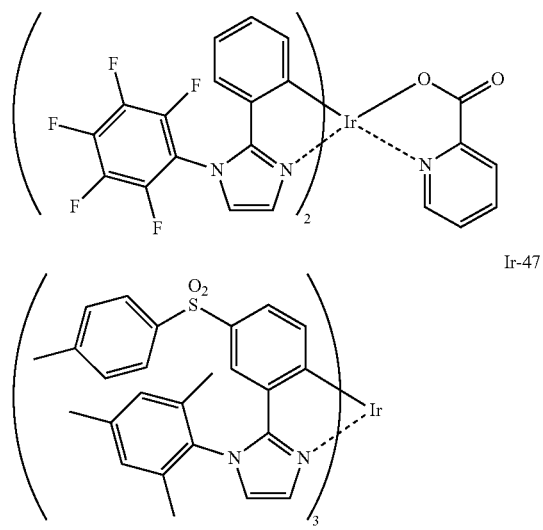

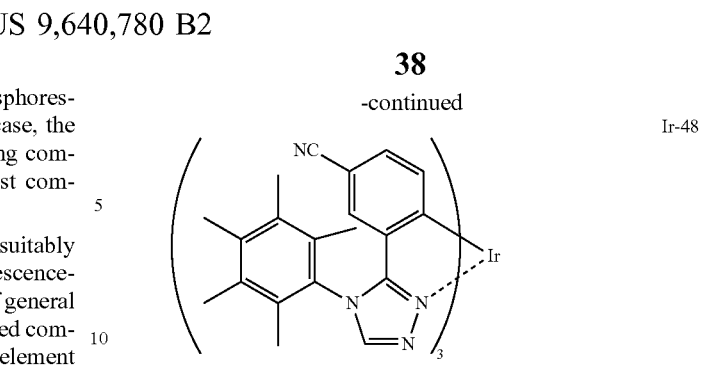

Note that, in an aspect, each of these phosphorescence-emitting compounds (also referred to as phosphorescence-emitting metal complexes) is contained in the light-emitting layer 25c of the organic EL element 20 as a light-emitting dopant, and may be contained in an organic functional layer in the layer other than the light-emitting layer 25c.

Furthermore, the phosphorescence-emitting compound can be suitably selected and used from the well-known phosphorescence-emitting compounds used for light-emitting layers 25c of organic EL elements 20.

The phosphorescence-emitting compound to be applied to the organic electroluminescent element is a complex-based compound containing metal of the groups 8 to 10 in the element periodic table, and an iridium compound, an osmium compound, a platinum compound (a platinum complex-based compound) or a rare earth complex, and an iridium compound.

The above-described phosphorescence-emitting compounds (also referred to as phosphorescence-emitting metal complexes and the like) can be synthesized by employing methods described in documents such as Organic Letters, vol. 3, No. 16, pp. 2579-2581 (2001); Inorganic Chemistry, vol. 30, No. 8, pp. 1685-1687 (1991); J. Am. Chem. Soc., vol. 123, p. 4304 (2001); Inorganic Chemistry, vol. 40, No. 7, pp. 1704-1711 (2001); Inorganic Chemistry, vol. 41, No. 12, pp. 3055-3066 (2002); New Journal of Chemistry, vol. 26, p. 1171 (2002); and European Journal of Organic Chemistry, vol. 4, pp. 695-709 (2004); and reference documents described in these documents.

(Fluorescence-Emitting Material)

Examples of the fluorescence-emitting material include a coumarin-based coloring matter, a pyran-based coloring matter, a cyanine-based coloring matter, a croconium-based coloring matter, a squarylium-based coloring matter, an oxobenzanthracene-based coloring matter, a fluorescein-based coloring matter, a rhodamine-based coloring matter, a pyrylium-based coloring matter, a perylene-based coloring matter, a stilbene-based coloring matter, a polythiophene-based coloring matter, or a rare earth complex-based fluorescent material or the like.

[Injection Layer: Positive Hole Injection Layer, Electron Injection Layer]

The injection layer is a layer disposed between an electrode and the light-emitting layer 25c in order to decrease a driving voltage and to enhance luminance of light emitted, which is detailed in Part 2, Chapter 2 "Denkyoku Zairyo" (pp. 123-166) of "Yuki EL Soshi To Sono Kogyoka Saizensen (Nov. 30, 1998, published by N. T. S Co., Ltd.)", and examples thereof include a positive hole injection layer 25a and an electron injection layer 25e.

The injection layer can be provided as necessary. The positive hole injection layer 25a is disposed between an anode and the light-emitting layer 25c or the positive hole transport layer 25b, and the electron injection layer 25e is disposed between a cathode and the light-emitting layer 25c or the electron transport layer 25d.

The positive hole injection layer 25a is also detailed in documents such as Japanese Patent Application Laid-Open Publication Nos. 9-45479, 9-260062 and 8-288069, and examples include a phthalocyanine layer represented by copper phthalocyanine, an oxide layer represented by vanadium oxide, an amorphous carbon layer, a polymer layer employing a conductive polymer such as polyaniline (emeraldine) or polythiophene, and the like.

The electron injection layer 25e is also detailed in documents such as Japanese Patent Application Laid-Open Publication Nos. 6-325871, 9-17574 and 10-74586 and examples include: a metal layer represented by strontium or aluminum, an alkali metal halide layer represented by potassium fluoride, an alkali earth metal compound layer represented by magnesium fluoride, an oxide layer represented by molybdenum oxide, and the like. The electron injection layer 25e is a very thin film, and the thickness thereof is within a range of 1 nm to 10 μm although it depends on the material thereof.

[Positive Hole Transport Layer]

The positive hole transport layer 25b is formed of positive hole transport material having a function of transporting positive holes, and a positive hole injection layer 25a and an electron blocking layer are also included in the positive hole transport layer 25b in the broad sense of the word. The positive hole transport layer 25b can be provided as a single layer or as a plurality of layers.

The positive hole transport material is a material having an injection capability or transport capability of positive holes, and barrier property against electrons and either an organic substance or an inorganic substance may be used. Examples include a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, and a conductive high molecular oligomer, particularly, a thiophene oligomer and the like.

Those described above can be used as the positive hole transport material. However, to use a porphyrin compound, an aromatic tertiary amine compound and a styrylamine compound, particularly, an aromatic tertiary amine compound.

Typical examples of the aromatic tertiary amine compound and the styrylamine compound include N,N,N',N'-tetraphenyl-4,4'-diaminophenyl; N,N'-diphenyl-N,N'-bis(3-methylphenyl)-[1,1'-biphenyl]-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbene; N-phenylcarbazole; those having two condensed aromatic rings in a molecule described in U.S. Pat. No. 5,061,569, for instance, 4,4'-bis[N-(1-naphthyl)-N-phenylamino]biphenyl (NPD), 4,4',4''-tris[N-(3-methylphenyl)-N-phenylamino]triphenylamine (MTDATA) in which three triphenylamine units are bonded in a star burst form described in Japanese Patent Application Laid-Open Publication No. 04-308688 and the like.

Furthermore, polymer materials in which these materials are introduced into a polymer chain or constitute a main chain of a polymer can also be used. In addition, inorganic compounds such as a p-type-Si and a p-type-SiC can also be used as the positive hole injection material and the positive hole transport material.

Moreover, it is also possible to use so-called p-type positive hole transport materials described in documents such as Japanese Patent Application Laid-Open Publication No. 11-251067 and Applied Physics Letters 80 (2002), p. 139 by J. Huang et. al. To use these materials in view of being able to obtain a light-emitting element having high efficiency.

The positive hole transport layer 25b can be formed by making the above-described positive hole transport material a thin film by a well-known method such as the vacuum vapor deposition method, the spin coating method, the casting method, the printing method including the ink-jet method or the LB method. The thickness of the positive hole transport layer 25b is not particularly limited, but the thickness is generally within a range about of 5 nm to 5 μm or within a range of 5 nm to 200 nm. This positive hole transport layer 25b may have a single layer structure constituted of one or two or more of the above-described materials.

Furthermore, it is possible to enhance the p property by doping the material of the positive hole transport layer 25b with impurities. Examples include those described in documents such as Japanese Patent Application Laid-Open Publication Nos. 04-297076, 2000-196140, 2001-102175 and J. Appl. Phys., 95, 5773 (2004).

As described above, the enhancement of a high p property of the positive hole transport layer 25b makes it possible to produce an element which consumes lower electric power.

[Electron Transport Layer]

The electron transport layer 25d is formed of a material having a function of transporting electrons, and, in a broad sense, the electron injection layer 25e and a positive hole blocking layer (not shown) are included in the electron transport layer 25d. The electron transport layer 25d can be provided as a single layer or a laminated layer of a plurality of layers.

In the electron transport layer 25d having a single layer structure and the electron transport layer 25d having a laminated layer structure, the electron transport material constituting a layer provided adjacent to the light-emitting layer 25c has a function of transporting electrons injected from the cathode to the light-emitting layer 25c. The material described above can be optionally selected and used from well-known compounds. Examples include a nitro-substituted fluorene derivative, a diphenylquinone derivative, a thiopyrandioxide derivative, carbodiimide, a fluorenylidenemethane derivative, anthraquinonedimethane, an anthrone derivative, and an oxadiazole derivative and the like. Furthermore, in the above-described oxadiazole derivative, a thiadiazole derivative which is formed by substituting the oxygen atom of the above oxadiazole ring by a sulfur atom, and a quinoxaline derivative having a quinoxaline ring which is well-known as an electron withdrawing group can be used as the material of the electron transport layer 25d. Moreover, polymer materials in which these materials are introduced into a polymer chain or constitute a main chain of a polymer can also be used.

Additionally, metal complexes of an 8-quinolinol derivative such as: tris(8-quinolinol)aluminum (Alq3), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis (8-quinolinol) zinc (Znq), and metal complexes in which the central metal of the these metal complexes is substituted by In, Mg, Cu, Ca, Sn, Ga or Pb can also be used as the material of the electron transport layer 25d.

Furthermore, a metal-free or metalphthalocyanine and those in which the terminals thereof are substituted by an alkyl group, a sulfonic acid group or the like can be used as the material of the electron transport layer 25d. Moreover, the distyrylpyrazine derivative mentioned as an example of the material of the light-emitting layer 25c can also be used as the material of the electron transport layer 25d. As same as the positive hole injection layer 25a and the positive hole transport layer 25b, inorganic semiconductors such as an n type-Si and an n type-SiC can also be used as the material of the electron transport layer 25d.

The electron transport layer 25d can be formed by thinning the above-described electron transport material by a well-known method such as the vacuum vapor deposition method, the spin coating method, the casting method, the printing method including the ink-jet method or the LB method. The thickness of the electron transport layer 25d is not particularly limited, but the thickness is generally within a range of 5 nm to 5 µm, within a range of 5 nm to 200 nm.

This electron transport layer 25d may have a single layer structure constituted of one or two or more of the above-described materials.

Furthermore, it is possible to enhance the n property by doping the material of the electron transport layer 25d, with impurities. Examples thereof include those described in documents such as Japanese Patent Application Laid-Open Publication Nos. 04-297076, 10-270172, 2000-196140 and 2001-102175 and J. Appl. Phys., 95, 5773 (2004). Moreover, to introduce potassium or a potassium compound into the electron transport layer 25d. Examples of the potassium compound that can be used include, for example, potassium fluoride, and the like. As described above, by enhancement of an n property of the electron transport layer 25d, an element which consumes lower electric power can be produced.

There can be used the compounds represented by the general formula (1), the general formula (2), and the general formula (3) described in Paragraphs [0057] to [0148] of Japanese Patent Application Laid-Open Publication No. 2013-4245, as the material (compound having electron transporting property) of the electron transport layer 25d; and the exemplified compounds 1 to 111 can be used. Furthermore, the compound 112 to 134 are shown in the following, as the other exemplified compounds. The compounds represented by the general formula (1), the general formula (2), and the general formula (3), described in Paragraphs [0057] to [0148] of Japanese Patent Application Laid-Open Publication No. 2013-4245 are incorporated into the present description.

[Chemical formula 3]

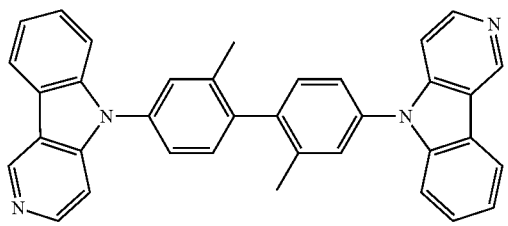

112

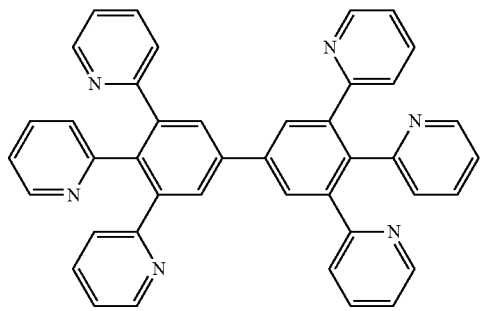

113

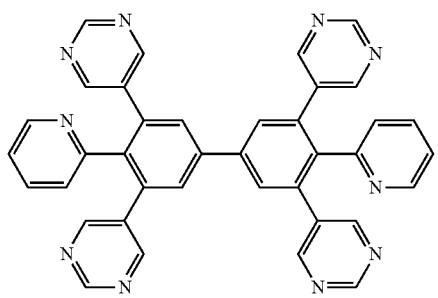

114

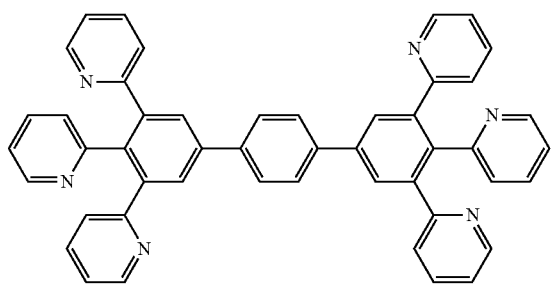

115

-continued
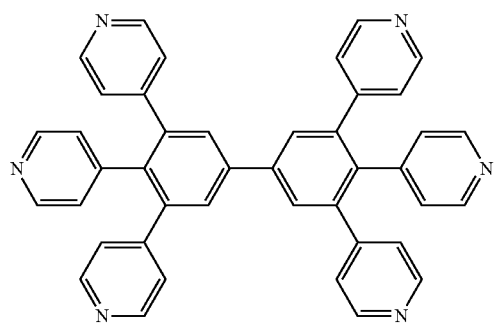
116
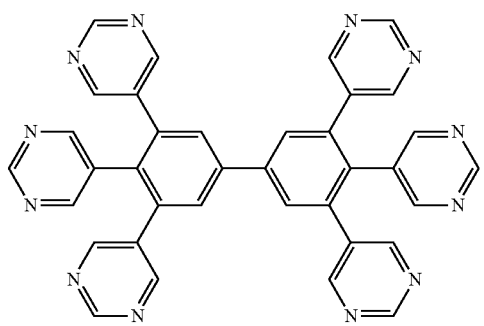
117
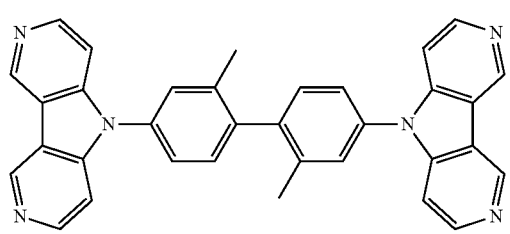
118
[Chemical formula 4]
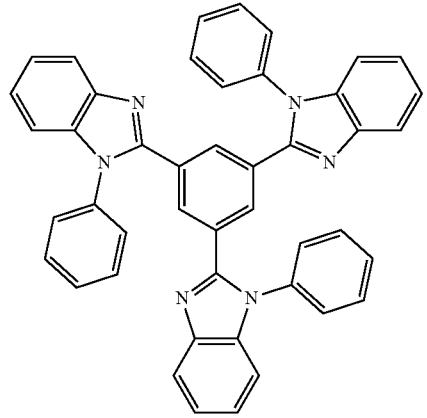
119
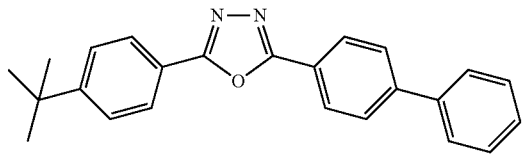
120
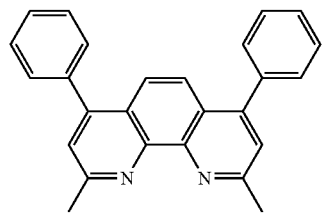
121
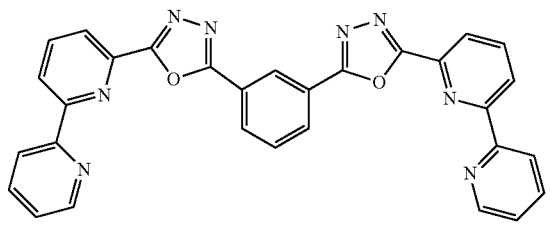
122
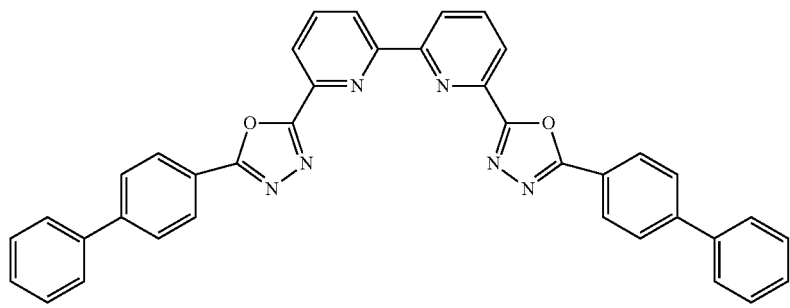
123

124
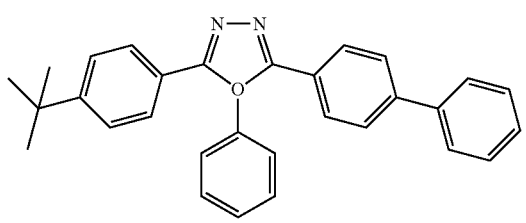
125
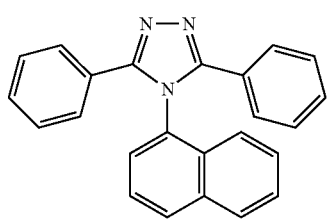
126
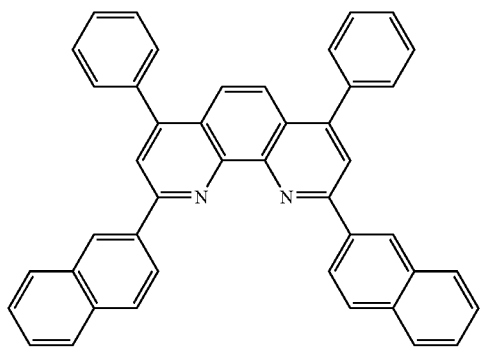
127
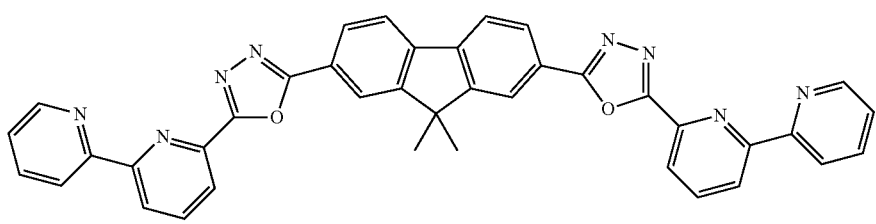
128
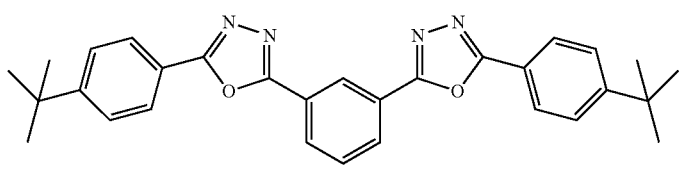
[Chemical formula 5]
129
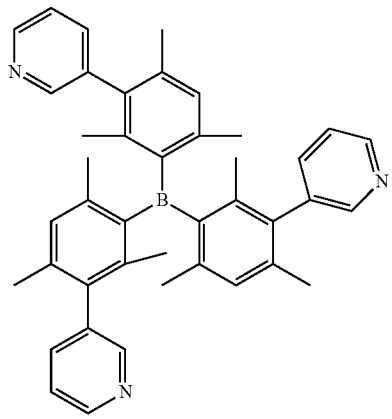
130
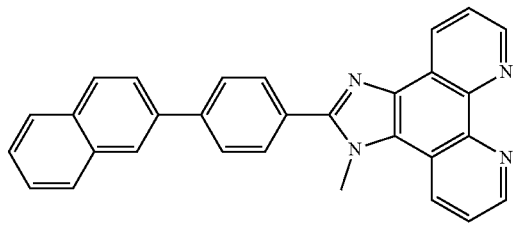

131

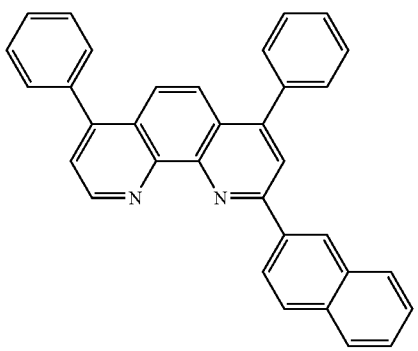

132

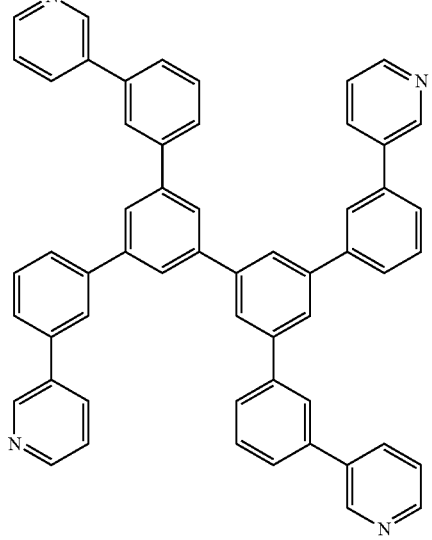

133

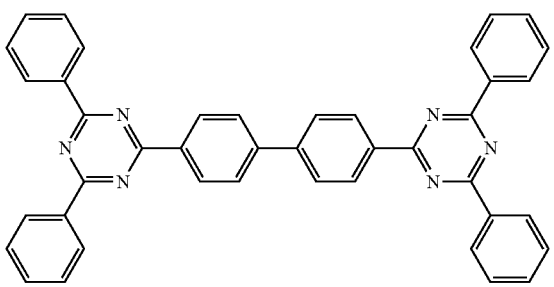

134

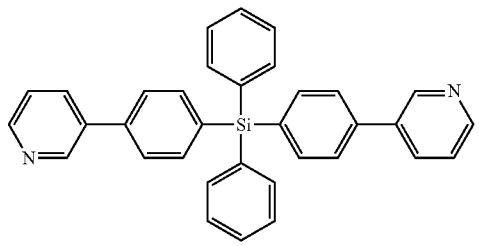

[Blocking Layer: Positive Hole Blocking Layer, Electron Blocking Layer]

The blocking layer is provided as necessary in addition to the basic constituent layers of thin organic compound films described above. Examples thereof include a positive hole blocking layer described in documents such as Japanese Patent Application Laid-Open Publication Nos. 11-204258, 11-204359, and p. 237 of "Yuki EL Soshi To Sono Kogyoka Saizensen (Organic EL Element and Front of Industrialization thereof) (Nov. 30, 1998, published by N. T. S Co., Ltd.)", and the like.

The positive hole blocking layer has a function of the electron transport layer 25d in a broad sense. The positive hole blocking layer is formed of a positive hole blocking material having a remarkably small capability to transport positive holes while having a function of transporting electrons and can increase recombination probability of electrons and positive holes by blocking positive holes while transporting electrons. Furthermore, as necessary, the configuration of an electron transport layer 25d described below can be used as the positive hole blocking layer. The positive hole blocking layer is provided adjacent to the light-emitting layer 25c.

On the other hand, the electron blocking layer has a function as the positive hole transport layer 25b in a broad sense. The electron blocking layer is formed of a material having a very little capability to transport electrons while having a function of transporting positive holes, and can increase the recombination probability of electrons and positive holes by blocking electrons while transporting positive holes. Furthermore, as necessary, the configuration of a positive hole transport layer 25b described below can be applied to the electron blocking layer. The thickness of the positive hole blocking layer according to the present invention is 3 to 100 nm, or 5 to 30 nm.

[Sealing Member]

A sealing member 28 is a material for covering the organic EL element 20, and a plate-like (film-like) sealing member 28 is fixed to a substrate 11 side by a resin layer 27. The sealing member 28 is provided in a state of covering at least the organic functional layer 25 and in a state of exposing the organic EL element 20 and the terminal part (not shown) of the second electrode 26. In addition, the sealing member 28 may be constituted so that an electrode is provided on the sealing member 28 and the electrode is electrically conducted with the organic EL element 20 and the terminal part (not shown) of the second electrode 26.

Specific examples of the plate-like (film-like) sealing member 28 include a glass substrate, a polymer substrate, and the sealing member 28 may be used by making these substrate materials into thinner-type films. Examples of glass substrate can include particularly soda lime glass, barium strontium-containing glass, lead glass, alminosilicate glass, borosilicate glass, barium borosilicate glass, quartz and the like. In addition, examples of the polymer substrate can include polycarbonate, acryl, polyethylene terephthalate, polyethersulfide, polysulfone, and the like.

Among them, the polymer substrate in the form of a thin film is used as the sealing member 28 from the viewpoint of thinning the element.

Furthermore, the polymer substrate in the form of a thin film has an oxygen transmittance measured in accordance with the method of JIS-K-7126-1987 of $1 \times 10^{-3}$ ml/(m$^2 \cdot$24 hr·atm) or less and a water vapor transmittance (25±0.5° C., relative humidity (90±2) % RH) measured in accordance with the method of JIS-K-7129-1992 of $1 \times 10^{-3}$ g/(m$^2 \cdot$24 hr) or less.

Moreover, the above substrate material may also be processed into the form of a recessed plate to thereby be used as the sealing member 28. In this case, processing such as sandblast processing or chemical etching processing is performed on the substrate member to thereby form recessed portions.

Additionally, a metal material may be used without being limited to the form. Examples of the metal materials include one or more metals or alloys selected from the group consisting of stainless steel, iron, copper, aluminum, magnesium, nickel, zinc, chromium, titanium, molybdenum, silicon, germanium and tantalum. The whole light-emitting panel provided with the organic EL element 20 can be made thinner by using such a metal material as the sealing member 28 in a thin type film shape.

[Sealing Resin Layer]

The sealing resin layer 27 for fixing the sealing member 28 to the base material 11 is also used in order to seal the organic EL element 20 held between the sealing member 28 and the base material 11. Such a structure in which the organic EL element provided on the base material 11 is covered by the sealing material is exemplified as a configuration of being solid-sealed. Examples of the sealing resin layer 27 include a photo-curable and thermosetting type adhesive such as an acrylic acid-based oligomer, methacrylic acid-based oligomer having a reactive vinyl group, a thermosetting or chemical curable (two liquids mixing type) adhesive such as epoxy-based adhesive, a hot-melt type adhesive such as polyamide, polyester, polyolefin, an ultraviolet curable-type epoxy resin adhesive of cationic curable-type.

From the viewpoint of ease of the producing process, the sealing resin layer 27 is formed by a thermosetting adhesive. In addition, the form of the sealing resin layer 27 is a thermosetting adhesive which is processed into a form of sheet. When using the sheet-like thermosetting adhesive, an adhesive (sealing material) which exhibits non-flowing property at normal temperature (around 25° C.), and which expresses flowability at a temperature within a range of 50 to 130° C. by heating is used.

An arbitrary adhesive can be used as the thermosetting adhesive. A suitable thermosetting adhesive is selected from the viewpoint of enhancement of adhesion to the sealing member 28 and the base material 11 which are adjacent to the sealing resin layer 27. For example, there can be used, as the thermosetting adhesive, a resin containing, as main components, a compound having ethylenic double bond at the end or branch of the molecule and a thermally curable adhesive. Alternatively, depending on a lamination device and curing treatment device used during the production processes of the organic EL element 20, a thermosetting adhesive of melt-type may be used.

Furthermore, two or more of the above-described adhesives may be used in a mixed manner, and an adhesive having thermosetting property and ultraviolet ray curable property may be used.

[Effects of Organic Electroluminescent Element]

The above-described organic EL element 20 can be enhanced in the adhesion between the base material and the sealing member by providing with the vapor deposition layer which is formed by the above-described plasma CVD method, contains silicon, oxygen and carbon, and has the distribution curve of each element which satisfies the above-described conditions (i) to (iii).

The above-described vapor deposition layer is formed by an inorganic film containing silicon, oxygen and carbon, and has a feature of excellent thermal diffusion. Particularly, it is considered that the heat conductivity is enhanced more than an inorganic film made of only silicon and oxygen, by containing carbon. Since the vapor deposition layer has a carbon content distribution in the direction of thickness, it is assumed that it has a feature similar to the configuration where plural layers having different compositions are laminated in the direction of thickness. Namely, the layer having excellent thermal diffusion is interposed by containing carbon in the laminated inorganic films, with the result that thermal diffusion in the direction of surface by the layer is enhanced. Therefore, it is considered that the vapor deposition layer can be endowed with excellent thermal diffusion.

Accordingly, when the treatment for curing the sealing resin layer is carried out at the solid sealing, the damage to the flexible base material such as the resin film can be suppressed. Particularly, also when a high-temperature treatment as curing treatment is carried out for a long time through the use of the thermosetting resin as the sealing resin layer, the thermal damage to the flexible base material can be alleviated by the fact that the vapor deposition layer diffuses away the heat applied to the organic EL element.

The curing treatment of sealing resin layer can be progressed even in the organic EL element which is easily to lower the adhesion between the sealing resin layer and the base material, by providing the polysilazane modified layer on the base material, and thus the adhesion between the sealing resin layer and the base material can be enhanced. Namely, it is possible to prevent the peeking-off of otect the organic EL element in a configuration of alleviating the unevenness of the surfaces of the base material and the vapor deposition layer, forming the polysilazane modified layer in order to prevent defects due to short-circuiting of electrodes and the like, and smoothing the surface where the electrode is formed.

As a result, in the organic EL element, it is possible to protect the electrode from short-circuiting and peeling-off. Accordingly, due to the above configuration, the reliability of the organic EL element can be enhanced.

Note that the explanation is done for the organic electroluminescent element of the bottom emission type where the base material, the vapor deposition layer and the polysilazane modified layer are provided, and the first electrode, the organic functional layer and the second electrode are provided thereon, and further the element is sealed in a solid manner. The organic electroluminescent element in which the element is provided on the base material, the vapor deposition layer and the polysilazane modified layer is not limited to the bottom emission type, but, for example, may be the top emission type in which the light is taken out from the second electrode, or may be the both emission type where the light is taken out from the both sides. In case that the organic electroluminescent element is the top emission type, the emitted light h is taken out from the second electrode by using a transparent material as the second electrode. In the case where the organic electroluminescent element is the both emission type, the emitted light h is taken out from both sides by using a transparent material as the second electrode.

[Uses of Organic Electroluminescent Element]

The organic electroluminescent elements having the above-described various configurations are surface emitting elements, and thus are usable for light-emitting sources of various types. Examples include a lighting device such as a home lighting device or a car lighting device, a backlight for a timepiece or a liquid crystal, a signboard for advertisement, a light source for a signal, a light source for an optical storage medium, a light source for an electrophotographic copier, a light source for an optical communication processor, a light source for an optical sensor, and the like. In addition, the uses are not limited to these light-emitting sources, but can also include other light sources.

Particularly, the element can be effectively used as a backlight for a liquid crystal display device which is combined with a color filter and as a light source for lighting.

Furthermore, the organic electroluminescent element in examples may be used as a kind of lamp such as a lighting device or an exposure light source, or may be used as a projection device of an image projecting type, or a display of a type by which a still image or moving image is visually recognized directly. In this case, a light-emitting surface area may be enlarged by so-called tiling in which light-emitting panels provided with the organic electroluminescent element are combined flatly in response to the recent increasing in size of a lighting device and a display device.

When using the organic electroluminescent element as a display device for reproducing a moving image, a driving system is either a simple matrix (passive matrix) system or active matrix system. In addition, when using two or more kinds of the organic electroluminescent element according having a different emission color, it is possible to produce a color or full color display device.

Examples

Hereinafter, the present invention will be explained more specifically on the basis of Examples, but the present invention is not limited to following Examples.

[Production of Organic Electroluminescent Element of Bottom Emission Type]

Respective organic EL elements of samples 101 to 108 were produced so that the area of a light-emitting region became 5 cm×5 cm. In Table 1 below, configurations of respective layers in the respective organic EL elements of samples 101 to 108 are shown.

[Production Procedure of Organic Electroluminescent Element of Sample 101]

In the production of the sample 101, first, a vapor deposition layer and a polysilazane modified layer were formed on a base material of the transparent biaxial stretched polyethylene naphthalate film, and thereon, an undercoat layer of the following compound 118 and an electrically conductive layer made of silver were formed to produce a translucent electrode. Furthermore, an organic functional layer and a counter electrode were formed on the translucent electrode, and then solid sealing was performed with a sealing resin layer and a sealing member to thereby produce an organic electroluminescent element of the sample 101.

(Formation of Vapor Deposition Layer)

The base material was attached to the above-described production apparatus shown in FIG. 5, the vapor deposition layer was produced on the base material at a thickness of 300 nm under the following film formation condition (plasma CVD condition).

Supply amount of raw material gas (HMDSO): 100 sccm (Standard Cubic Centimeter per Minute)
Supply amount of oxygen gas ($O_2$): 500 sccm
Degree of vacuum in vacuum chamber: 3 Pa
Applied electric power from power source for plasma generation: 1.2 kW
Frequency of power source for plasma generation: 80 kHz
Transporting speed of film: 0.5 m/min.

(Surface Treatment by Excimer Lamp)

The formed vapor deposition layer was fixed on the operation stage of the excimer irradiation apparatus MECL-M-1-200 (manufactured by M.D.Com), the surface treatment was carried out under the following condition, and the silicon compound constituting the vapor deposition layer was subjected to modification treatment.

Irradiation wavelength: 172 nm
Gas sealed in lamp: Xe
Excimer lamp light intensity: 130 mW/cm2 (172 nm)
Distance between sample and light source: 1 mm
Stage heating temperature: 70° C.
Oxygen concentration in irradiation apparatus: 1.0%
Excimer lamp irradiation time: 1 sec (Formation of Polysilazane Modified Layer)

Next, the polysilazane modified layer was formed on the surface-treated vapor deposition layer.

First, a 10% by mass of dibutyl ether solution of paerhydropolysilazane (AQUAMICA NN120-10, non-catalytic type, manufactured by AZ Electronic Materials Co., Ltd.) was produced as a polysilazane-containing liquid.

Next, the polysilazane-containing liquid was coated on the base material by using a wireless bar so as to have a dry average thickness of 300 nm, and was treated for 1 minute under the atmosphere of the temperature of 85° C., humidity 55% RH to thereby be dried. Further, the moisture removing treatment was performed after the resultant coated film was kept for 10 minutes under the atmosphere of the temperature of 25° C. and humidity 10% RH (drew point-8° C.), with the result that the polysilazane-coating film was formed.

Subsequently, the modification treatment was performed under the following modification condition after the base material obtained by forming the polysilazane-coating film was fixed on the operation stage of the excimer irradiation apparatus MECL-M-1-200 (manufactured by M.D.Com), with the result that the polysilazane modified layer was formed.

Irradiation wavelength: 172 nm
Gas sealed in lamp: Xe
Excimer lamp light intensity: 130 mW/cm$^2$ (172 nm)
Distance between sample and light source: 1 mm
Stage heating temperature: 70° C.
Oxygen concentration in irradiation apparatus: 0.5%
Excimer lamp irradiation time: 5 sec.

(Formation of Undercoat Layer and First Electrode)

Next, the base material obtained by forming the polysilazane modified layer was fixed onto a base material holder of a commercial vapor deposition apparatus, the compound 118 was placed in the resistance heating boat made of tungsten, and then the base material holder and the heating boat were attached to a first vacuum tank of the vacuum vapor deposition apparatus. In addition, silver (Ag) was placed in the resistance heating boat made of tungsten, and was attached to the second vacuum tank of the vacuum vapor deposition apparatus.

Next, after reducing a pressure of the first vacuum tank of the vacuum vapor deposition apparatus to 4×10$^{-4}$ Pa, the heating boat obtained by placing the compound 118 was heated by applying an electric current, and then, the undercoat layer of the first electrode having a thickness of 10 nm was provided at a deposition rate of 0.1 nm/sec to 0.2 nm/sec.

Then, the base material obtained by forming the undercoat layer was moved to the second vacuum tank under vacuum, and after reducing a pressure of the second vacuum tank to $4 \times 10^{-4}$ Pa, the heating boat containing silver was heated by applying an electric current. Thereby, there was formed the first electrode made of silver having a thickness of 8 nm at a deposition rate of 0.1 nm/sec to 0.2 nm/sec.

(Organic Functional Layer to Second Electrode)

Subsequently, while moving the base material after reducing a pressure to a degree of vacuum of $1 \times 10^{-4}$ Pa by using the commercially available vacuum vapor deposition apparatus, the compound HT-1 was deposited at a deposition rate of 0.1 nm/sec, with the result that the positive hole transport layer (HTL) of 20 nm was provided.

After that, by using the compound A-3 (blue light-emitting dopant), the compound A-1 (green light-emitting dopant), the compound A-2 (red light-emitting dopant) and the compound H-1 (host compound), the light-emitting layer having the thickness of 70 nm was formed in the co-deposition manner that the compound A-3 was deposited by changing the deposition rate linearly depending on the position so as to be 35% by weight to 5% by weight in the direction of thickness, the compound A-1 and the compound A-2 were deposited at a deposition rate of 0.0002 nm/sec to be a concentration of 0.2% by weight regardless to the film thickness, and the compound H-1 was deposited by changing the deposition rate linearly depending on the position so as to be 64.6% by weight to 94.6% by weight.

After that, the electron transport layer was formed by deposition of the compound ET-1 at a film thickness of 30 nm, and further a potassium fluoride (KF) layer was formed at a thickness of 2 nm. Furthermore, the second electrode was formed by deposition of aluminum at a thickness of 110 nm.

Note that the compound 118, the compound HT-1, the compounds A-1 to -3, the compound H-1, and the compound ET-1 are the compounds shown in the followings.

[Chemical formula 6]

118

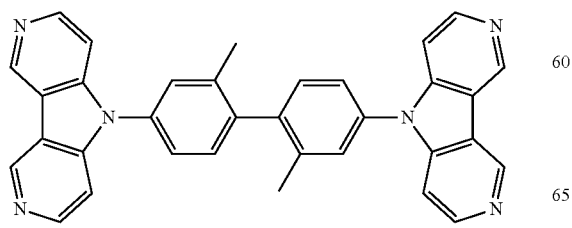

HT-1

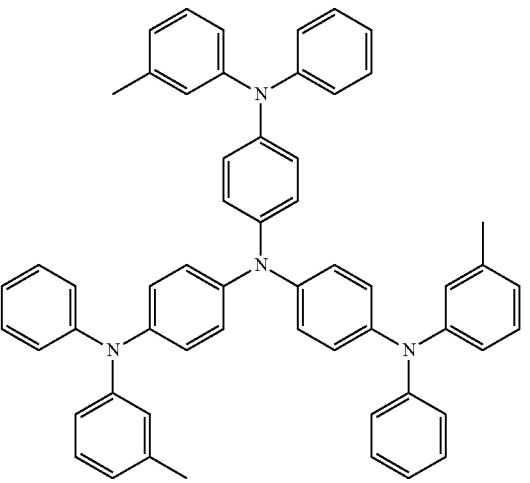

A-1

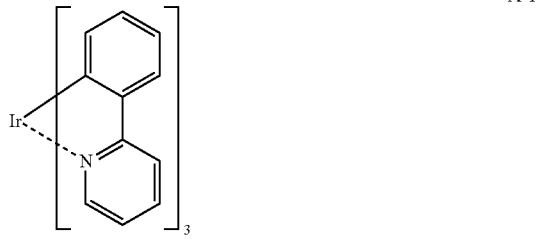

A-2

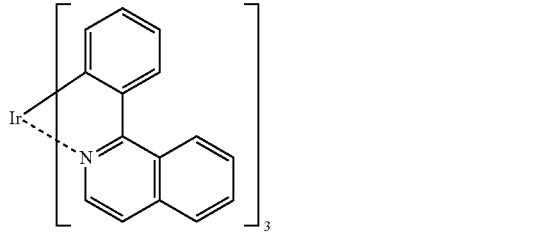

A-3

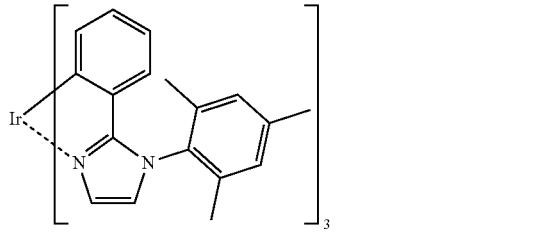

H-1

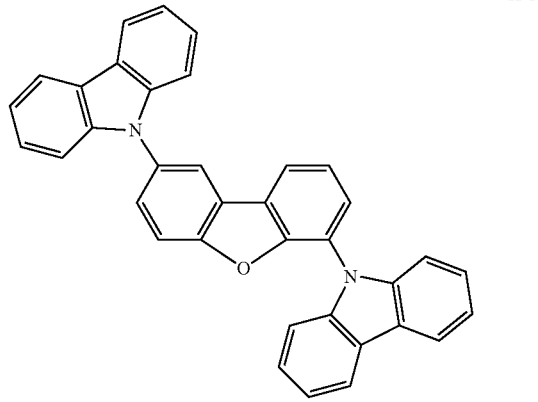

-continued

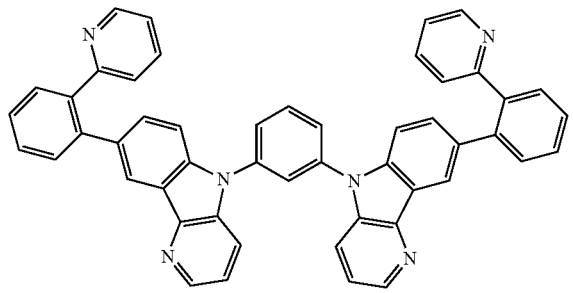

ET-1

(Solid Sealing)

Next, a thermosetting sheet-like adhesive (epoxy based resin) as a sealing resin layer was pasted at a thickness of on one side of the aluminum foil to be used, having a thickness of 25 μm as a sealing member, was overlapped on the sample obtained by producing the second electrode. At this time, the adhesive forming surface of the sealing member and the organic functional layer surface of the element were continuously overlapped so that the ends of extraction electrodes of the first electrode and the second electrode were exposed outside.

Next, the sample was disposed in a reduced pressure device and was held for five minutes while pressure was applied to the overlapped base materials each other under conditions of 90° C. and a reduced pressure of 0.1 MPa. Subsequently, the overlapped members were returned to the atmospheric pressure circumstance and were further heated at 120° C. for 30 minutes, with the result that the adhesive was cured.

The above-described sealing process was performed under the atmospheric pressure and under a nitrogen atmosphere of a moisture content of 1 ppm or less, in accordance with JIS B 9920, under conditions of measured cleanness of class 100, a dew-point temperature of −80° C. or less, an oxygen concentration of 0.8 ppm or less and atmospheric pressure. Note that descriptions related to the formation or the like of an extraction wiring from the first electrode and the second electrode are omitted.

According to the above-described process, the organic EL element of the sample 101 was produced.

[Procedure for Producing Organic Electroluminescent Element of Sample 102]

The organic EL element of Sample 102 was produced in the same procedures as in Sample 101 except that the ITO electrode of 100 nm was formed as the first electrode by sputtering film forming method.

[Procedure for Producing Organic Electroluminescent Element of Sample 103]

The organic EL element of Sample 103 was produced in the same procedures as in Sample 102 except that the surface treating condition of the vapor deposition layer was changed to the UV treatment under the following condition.
(Surface Treatment by UV Irradiation)

The sample obtained by fixing the vapor deposition layer formed to the operation stage of the ultraviolet irradiation apparatus UVH-0252C (manufactured by USHIO Co., Ltd.) was surface-treated under the following condition.

UV light intensity: 2000 mW/cm$^2$
Distance between sample and light source: 30 mm
Stage heating temperature: 40° C.
Oxygen concentration in irradiation apparatus: 5%
UV irradiation time: 180 sec.

[Procedure for Producing Organic Electroluminescent Element of Sample 104]

The organic EL element of Sample 104 was produced in the same procedures as in Sample 101 except that the condition for forming the vapor deposition layer was changed to the following condition.
(Formation of Vapor Deposition Layer)

The base material was attached to the above-described production apparatus shown in FIG. 5, the vapor deposition layer was produced on the base material at a thickness of 300 nm under the following film formation condition (plasma CVD condition).

Supply amount of raw material gas (HMDSO): 50 sccm (Standard Cubic Centimeter per Minute)
Supply amount of oxygen gas (O$_2$): 500 sccm
Degree of vacuum in vacuum chamber: 3 Pa
Applied electric power from power source for plasma generation: 1.2 kW
Frequency of power source for plasma generation: 80 kHz
Transporting speed of film: 0.5 m/min.

[Procedure for Producing Organic Electroluminescent Element of Sample 105]

The organic EL element of Sample 105 as produced in the same procedures as in Sample 104 except that the surface treating condition of the vapor deposition layer was changed to the excimer treatment under the following condition.
(Surface Treatment by Excimer Lamp)

The formed vapor deposition layer was fixed on the operation stage of the excimer irradiation apparatus MECL-M-1-200 (manufactured by M.D.Com), the surface treatment was carried out under the following condition, and the silicon compound constituting the vapor deposition layer was subjected to modification treatment.

Irradiation wavelength: 172 nm
Gas sealed in lamp: Xe
Excimer lamp light intensity: 130 mW/cm2 (172 nm)
Distance between sample and light source: 1 mm
Stage heating temperature: 70° C.
Oxygen concentration in irradiation apparatus: 1.0%
Excimer lamp irradiation time: 3 sec

[Procedure for Producing Organic Electroluminescent Element of Sample 106]

The organic EL element of Sample 106 was produced in the same procedures as in Sample 104 except that the organic EL element was forme without forming the polysilazane modified layer. According to the element, the undercoat layer was formed on the vapor deposition layer.

[Procedure for Producing Organic Electroluminescent Element of Sample 107]

The organic EL element of Sample 107 was produced in the same procedures as in Sample 104 except that the surface treatment of the vapor deposition layer was not carried out. According to the element, the polysilazane modified layer was formed without carrying out the surface treatment on the silicon compound, after forming the vapor deposition layer by the vapor deposition method.

[Procedure for Producing Organic Electroluminescent Element of Sample 108]

The organic EL element of Sample 108 was produced in the same procedures as in Sample 101 except that the condition for forming the vapor deposition layer was changed to the following condition.
(Formation of Vapor Deposition Layer)

The base material was attached to the commercially available atmospheric pressure plasma discharge treatment apparatus of roll-to-roll manner, the three-layered vapor deposition layer of the first vapor deposition layer, the second vapor deposition layer and the third vapor deposition layer was formed on the base material under the following film formation conditions (atmospheric pressure plasma CVD: AGP). The produced thicknesses of the first vapor deposition layer, the second vapor deposition layer and the third vapor deposition layer were 100 nm, 30 nm and 30 nm, respectively, and total was 160 nm.

(Formation of First Vapor Deposition)
  Discharge gas: $N_2$ gas
  Reaction gas 1: Hydrogen gas being 1% to the whole gas
  Reaction gas 2: TEOS (tetraethoxysilan) being 0.5% to the whole gas
  Film forming condition;
  First electrode side
    Type of power source: OYO Electric Co., Ltd. 80 kHz
    Frequency: 80 kHz
    Output density: 8 W/cm$^2$
    Electrode temperature: 115° C.
  Second electrode side
    Type of power source: PEARL KOGYO, INC. 13.56 MHz CF-5000-13M
    Frequency: 13.56 MHz
    Output density: 10 W/cm$^2$
    Electrode temperature: 95° C.
(Formation of Second Vapor Deposition)
  Discharge gas: $N_2$ gas
  Reaction gas 1: Oxygen gas being 5% to the whole gas
  Reaction gas 2: TEOS being 0.1% to the whole gas
  Film forming condition;
  First electrode side
    Type of power source: HAIDEN LABORATORY 100 kHz (Continuous mode) PHF-6k
    Frequency: 100 kHz
    Output density: 10 W/cm$^2$
    Electrode temperature: 120° C.
  Second electrode side
    Type of power source: PEARL KOGYO, INC. 13.56 MHz CF-5000-13M
    Frequency: 13.56 MHz
    Output density: 10 W/cm$^2$
    Electrode temperature: 95° C.
(Formation of Third Vapor Deposition)
  Discharge gas: $N_2$ gas
  Reaction gas 1: Hydrogen gas being 1% to the whole gas
  Reaction gas 2: TEOS being 0.5% to the whole gas
  Film forming condition;
  First electrode side
    Type of power source: OYO Electric Co., Ltd. 80 kHz
    Frequency: 80 kHz
    Output density: 8 W/cm$^2$
    Temperature of electrode: 120° C.
  Second electrode side
    Type of power source: PEARL KOGYO, INC. 13.56 MHz CF-5000-13M
    Frequency: 13.56 MHz
    Output density: 10 W/cm$^2$
    Electrode temperature: 100° C.

The configurations of the organic EL elements of Samples 101 to 108 will be shown in Table 1.

TABLE 1

| Sample | Vapor deposition layer Configuration | Vapor deposition layer Surface treatment | Vapor deposition layer Treatment time | Polysilazane modified layer | First electrode | |
|---|---|---|---|---|---|---|
| 101 | Mono layer | Excimer treatment | 1 sec. | PHPS | Ag | Present invention |
| 102 | Mono layer | Excimer treatment | 1 sec. | PHPS | ITO | Present invention |
| 103 | Mono layer | UV treatment | 180 sec. | PHPS | ITO | Present invention |
| 104 | Mono layer | Excimer treatment | 1 sec. | PHPS | Ag | Present invention |
| 105 | Mono layer | Excimer treatment | 3 sec. | PHPS | Ag | Present invention |
| 106 | Mono layer | Excimer treatment | 1 sec. | — | Ag | Comparative |
| 107 | Mono layer | — | — | PHPS | Ag | Comparative |
| 108 | Three-layered | Excimer treatment | 1 sec. | PHPS | Ag | Comparative |

[Evaluation of Organic Electroluminescent Element]
(Vapor Deposition Layer: Change in Composition)

As to the vapor deposition layers of Sample 101, Sample 104 and Sample 108, the distribution curve of silicon, the distribution curve of carbon, the distribution curve of nitrogen, and the distribution curve of oxygen were measured. The distribution curve of each element was measured according to the XPS depth profile measurement of using the X ray photon spectrum method in combination with the rare gas ion sputtering method such as argon and of analyzing surface composition while exposing the inside of the sample in the order.

Figure 7:
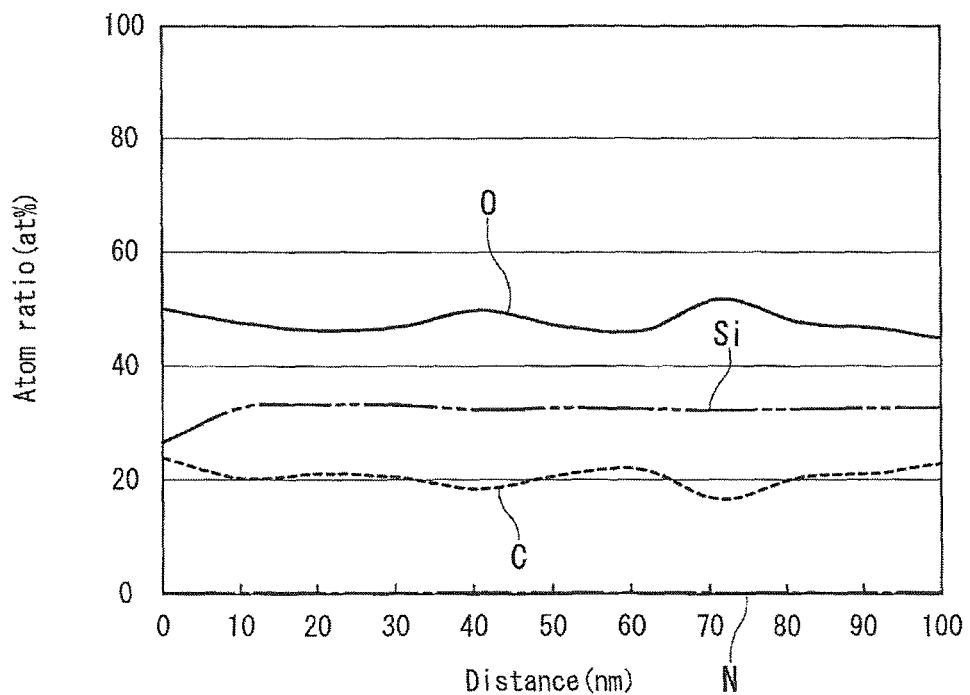
FIG. 7 is a graph illustrating a distribution curve of element of Sample 101.
Figure 8:
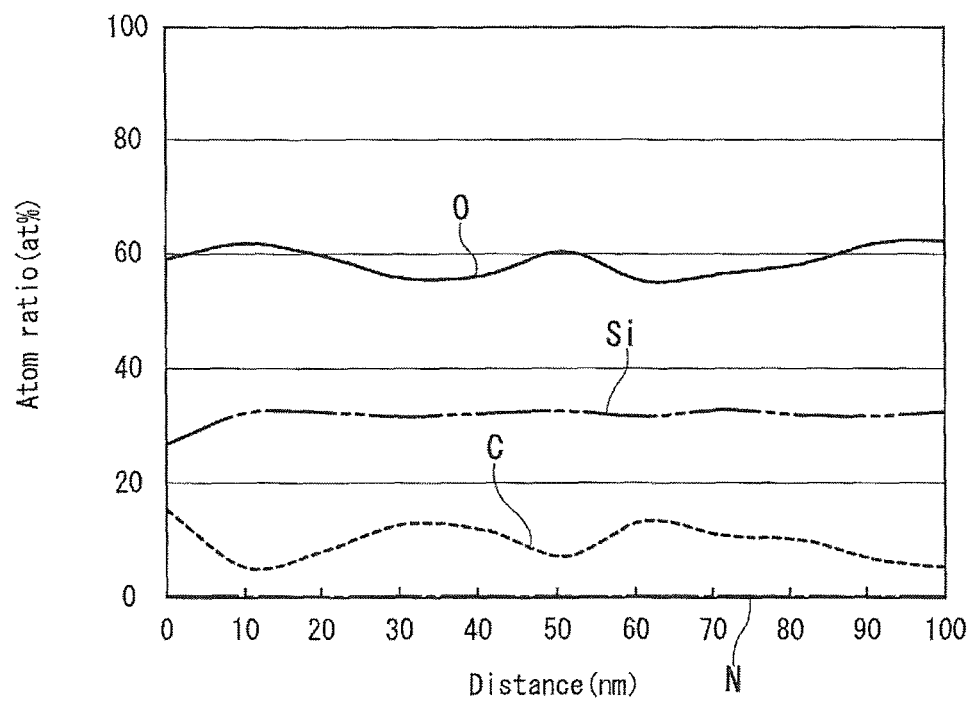
FIG. 8 is a graph illustrating a distribution curve of element of Sample 104.

The distribution curve measured as to Sample 101 is shown in FIG. 7. In addition, the distribution curve measured as to Sample 104 is shown in FIG. 8.

(Light Emission Efficiency)

The front luminance and the angle dependency of luminance on the organic EL element of Samples 101 to 108 were measured by using the spectral emission luminance meter CS-1000 (manufactured by CONIKA MINOLTA SENCING), and the electric power efficiency at a front luminance of 1000 cd/m$^2$ was evaluated. The evaluation of the electrode efficiency was carried out by making a comparison on the basis of relative value with the electric power of Sample 101 being set to 100, and by classifying the following 5 stages.
5: 110 or more
4: 91 to 109
3: 80 to 90
2: 80 or less
1: 70 or less (Leak Property)

The electric current, due to positive electric voltage and reversed voltage, passing through the organic EL element at room temperature and at 500 µA/cm$^2$ was measured three times, and a rectification ratio was calculated from the mean value. It is shown that the higher the rectification ratio is, the more excellent the leak property is. The results of the evaluation (5 grade evaluation) are shown in Table 2.
Rectification Rank
5: Rectification of 10000 or more (a level where drive is very stable)
4: Rectification of 1000 or more to less than 10000 (a level where drive is stable)
3: Rectification of 500 or more to less than 1000 (level of being slightly inferior but of having practically no trouble)

2: Rectification of 100 or more to less than 500 (level of being inferior and of having practical trouble)

1: Rectification of less than 100 (level of being very inferior and of having practical trouble)

(Storage Property)

The state of luminance unevenness at the time of generation or the like of dark spot, was observed from 0 day to 120 days while an electric current was applied to the organic EL element of Samples 101 to 108 under the circumstance of 60° C. and 90% RH. The luminance unevenness of each sample was classified into the following 5 grades and evaluated.

5: On 0 day, there was not observed any dark spot and brightness unevenness, and after 120 days, the non-light-emitting region was 0.1% or less of the whole light-emitting area, and each of dark spots generated had a size (0.1 mm diameter or less) which was not able to be easily observed with naked eyes.

4: On 0 day, each of the dark spots generated had a size (0.1 mm or less) which was not able to be easily observed with naked eyes, and no brightness unevenness was observed, and after 120 days, the non-light-emitting region was 0.2% or less of the whole light-emitting area, and each of dark spots generated maintained a size (0.1 mm or less) which was not able to be easily observed with naked eyes.

3: On 0 day, each of the dark spots generated had a size (0.1 mm or less) which was not able to be easily observed with naked eyes, and after 120 days, the non-light-emitting region exceeded 2% of the whole light-emitting area.

2: On 0 day, the dark spots generated which was able to be observed with naked eyes and brightness unevenness, and after 120 days, the non-light-emitting region exceeded 2% of the whole light-emitting area.

1: On 0 day, the dark spots generated which was able to be observed with naked eyes and the non-light-emitting region of the brightness unevenness was observed by exceeding 1% of the whole light-emitting area, and within 120 days, the non-light-emitting region exceeded 10% of the whole light-emitting area.

The results (5 grade evaluation) are shown in Table (Bending Storage Property)

In order to confirm the change in dark spot before and after bending as to the dark spot of the organic EL element of Samples 101 to 108, the element was bended 100 times at an angle of 180 degrees repeatedly so as to be a radius curvature of 10 mm, and then was maintained in the same condition as in the above storage property test. The luminance unevenness of each sample was classified into 5 grades under the same standard of the storage property as the above and was evaluated.

The results (5 grade evaluation) are shown in Table 2.

(Contact Angle with Water)

As to the vapor deposition layer of the organic EL element of Samples 101 to 108, the contact angle with water before and after the surface modification was measured. The contact angle with water was measured at total 121 points at intervals of 3 mm in the area of 30 mm×30 mm, by using the automatic contact angle meter DM-901 (manufactured by Kyowa Interface Science Co., Ltd.). A mean value was calculated from the data obtained before and after the surface modification, to thereby be the average contact angel (°).

In addition, from the mean of the measurement values, variation of the measurement values was classified by the following levels.

The results (5 grade evaluation) are shown in Table 2.

5: The measurement values at 100 or more points are within the range of ±5% of the mean value.

4: The measurement values at 100 or more points are within the range of ±10% of the mean value.

3: The measurement values at 100 or more points are within the range of ±20% of the mean value.

2: The measurement values at 100 or more points are within the range of ±30% of the mean value.

1: The measurement values at 100 or more points are within the range of ±40% of the mean value.

The results of each evaluation of the organic EL element of the above Samples 101 to 108 are shown in Table 2.

TABLE 2

| | | | | | | Contact angle with water | | | | |
| | | | | | | Before surface treatment | | After surface treatment | | |
| | Change in | | | Bending | | | | | | |
| Sample | composition (%/thickness) | Luminance efficiency | Leak property | Storage property | storage property | Mean (°) | Variation classification | Mean (°) | Variation classification | |
|---|---|---|---|---|---|---|---|---|---|---|
| 101 | 3%/30 nm | 4 | 4 | 4 | 4 | 55 | 2 | 10 | 5 | Present invention |
| 102 | 3%/30 nm | 3 | 3 | 4 | 3 | 55 | 2 | 10 | 5 | Present invention |
| 103 | 3%/30 nm | 3 | 3 | 3 | 3 | 55 | 2 | 10 | 4 | Present invention |
| 104 | 10%/15 nm | 5 | 5 | 5 | 4 | 55 | 3 | 5 | 5 | Present invention |
| 105 | 10%/15 nm | 5 | 5 | 5 | 5 | 55 | 3 | 0 | 5 | Present invention |
| 106 | 10%/15 nm | 3 | 2 | 2 | 1 | 55 | 3 | 0 | 5 | Comparative |
| 107 | 10%/15 nm | 3 | 3 | 2 | 2 | 55 | 3 | 55 | 3 | Comparative |
| 108 | 1% or less/30 nm | 3 | 2 | 1 | 2 | 65 | 2 | 15 | 2 | Comparative |

[Results]

(Change in Composition)

In the present example, the change in composition of the silicon compound constituting the vapor deposition layer is represented by the change in the atom ratio of carbon. From the results of FIGS. 7 and 8, Sample 101 has the change in composition by 3% or more at a depth of 30 nm from the surface. Sample 107 has the change in composition by 10% or more at a depth of 15 nm from the surface.

These results show that Sample 102, Sample 103 which were produced in the same production method as in Sample 101 have the change in composition by 3% at a depth of 30 nm from the surface. Further, Samples 105 to 107 which were produced in the same production method as in Sample 104 have the change in composition by 10% at a depth of 15 nm from the surface.

Further, Sample 108 has the change in composition by 1% or less at a depth of 30 nm from the surface. Sample 108 was formed by the atmospheric plasma deposition method (CVD) so that the composition of each of the layers constituting the vapor deposition layer was uniform, and had the configuration in which the three layers with the uniform composition were laminated. Therefore, the vapor deposition layer of Sample 108 does not have the continuous change in composition of the silicon compound as in the vapor deposition layers in Samples 101 to 107.

(Evaluation of Each Property)

In Samples 101 to 103 where the composition of the vapor deposition layer is changed at 30 nm depth from the surface by 3% or more, Sample 101 in which the first electrode is made of Ag has the highest luminance efficiency.

Also, Sample 101, Sample 102 in which the surface treatment is conducted by the excimer treatment have a small contact angle after the surfaces treatment than Sample 103 in which the surface treatment is conducted by the UV treatment. The decrease in the contact angle shows that the surface of the vapor deposition layer becomes hydrophilic.

The results show that the storage property of the organic EL element is enhanced by the fact that the surface of the vapor deposition layer becomes hydrophilic.

In Sample 104, Sample 105 in which the composition of the vapor deposition layer is changed at a depth of 15 nm from the surface by 10% or more, the properties of Sample 105 in which the period of time of the surface treatment is longer are enhanced. When the period of time of the surface treatment is long, the surface treatment can be carried out with a larger energy. It is considered that the storage property is enhanced because the modification of the surface of the vapor deposition layer is progressed and the hydrophilic property of the vapor deposition layer is enhanced.

In addition, by comparing Samples 101, 102 with Sample 104, it is found that the properties of Sample 104 which has larger change in composition of the surface of the vapor deposition layer are enhanced. The result shows that, in the case where the surface treatment conditions are the same, the modification treatment of the vapor deposition layer is promoted and the properties are enhanced, by the fact that the change in composition of the surface of the vapor deposition layer is large.

In Sample 106 which is not provided with the polysilazane modified layer, the undercoat layer and the first electrode are formed on the vapor deposition layer. Since the vapor deposition layer has a rough surface, the leak property and the storage property are lowered in comparison with Sample 104.

In addition, In Sample 107 in which the surface treatment is not carried out, since the adhesion between the vapor deposition layer and the polysilazane modified layer is weak, the storage property is lowered in comparison with Sample 104.

In Sample 108 in which the vapor deposition layer does not have the change in composition, since the adhesion between the vapor deposition layer and the polysilazane modified layer is weak as in Sample 107, the leak property and the storage property are lowered in comparison with Sample 104.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

10 Gas barrier film, 11 Base material, 12 Vapor deposition layer, 13 Polysilazane modified layer, 20 Organic EL element, 24 First electrode, 25 Organic functional layer, 25a Positive hole injection layer, 25b Positive hole transport layer, 25c Light-emitting layer, 25d Electron transport layer, 25e Electron injection layer, 26 Second electrode, 27 Sealing resin layer, 28 Sealing member, 30 Production apparatus, 31 Feeding roll, 32, 33, 34, 35 Conveying roll, 36, 37 Film-forming roll, 38 Gas supply pipe, 39 Power source for generating plasma, 40 Film, 41, 42 Magnetic field-generating devices, 43 Winding roll

The invention claimed is:

1. A gas barrier film comprising:
    a base material;
    a vapor deposition layer that is of a surface-treated silicon compound, contains at least one element selected from carbon (C), nitrogen (N), and oxygen (O), and has a continuous change in composition from the surface toward the direction of thickness; and
    a polysilazane modified layer adjacent to the vapor deposition layer.

2. The gas barrier film according to claim 1, wherein a composition change of the vapor deposition layer is 5% or more at a region of a depth of 30 nm from the surface.

3. The gas barrier film according to claim 1, wherein a composition change of the vapor deposition layer is 10% or more at a region of a depth of 15 nm from the surface.

4. The gas barrier film according to claim 1, wherein the vapor deposition layer is modified by a vacuum ultraviolet ray irradiation using a rare gas excimer lamp.

5. The gas barrier film according to claim 1, wherein the vapor deposition layer has at least one extreme value in a distribution of a refractive index in a direction of thickness.

6. A method for producing a gas barrier film comprising the steps of:
    forming, on a base material, a vapor deposition layer that contains at least one element selected from carbon (C), nitrogen (N), and oxygen (O), and has a continuous change in composition from the surface toward a direction of thickness;
    surface-treating the vapor deposition layer; and
    forming a polysilazane modified layer on and adjacent to the vapor deposition layer after being surface-treated.

7. The method for producing a gas barrier film according to claim 6, wherein the surface treatment of the vapor deposition layer is vacuum ultraviolet ray irradiation using a rare gas excimer lamp.

8. The method for producing a gas barrier film according to claim 6, wherein the step of forming the polysilazane modified layer includes a step of coating a coating liquid containing a silazane compound on the vapor deposition layer, and a step of subjecting the coating film containing the silazane compound to modification treatment.

9. An organic electroluminescent element comprising:
    a gas barrier film comprising a base material, a vapor deposition layer that is of a surface-treated silicon compound, contains at least one element selected from carbon (C), nitrogen (N), and oxygen (O), and has a continuous change in composition from the surface toward the direction of thickness, and a polysilazane modified layer adjacent to the vapor deposition layer;
a pair of electrodes; and
an organic functional layer having at least one light-emitting layer between the electrodes.

10. The organic electroluminescent element according to claim 9, wherein at least one of the electrodes contains silver as a main component.

11. The organic electroluminescent element according to claim 10, which is solid-sealed by the base material and a sealing member bonded to the base material with a sealing resin layer.

* * * * *